United States Patent
Kawaguchi

[19]

[11] Patent Number: 5,926,632
[45] Date of Patent: Jul. 20, 1999

[54] CIRCUIT PARTITIONING METHOD, CIRCUIT PARTITIONING APPARATUS, AND COMPUTER-READABLE RECORDING MEDIUM HAVING THEREON CIRCUIT PARTITIONING PROGRAM

[75] Inventor: Kenichi Kawaguchi, Hyogo, Japan

[73] Assignee: Matsushita Electric Industrial Co., Ltd., Osaka, Japan

[21] Appl. No.: 08/835,712

[22] Filed: Apr. 10, 1997

[30] Foreign Application Priority Data

Apr. 11, 1996  [JP]  Japan ..................... 8-089202

[51] Int. Cl.$^6$ .................................................. G06F 17/50
[52] U.S. Cl. .......................................... 395/500.08
[58] Field of Search .................... 364/488, 489, 364/490, 491

[56] References Cited

U.S. PATENT DOCUMENTS

| | | | |
|---|---|---|---|
| 3,617,714 | 11/1971 | Kernighan et al. ................ | 364/488 |
| 4,908,772 | 3/1990 | Chi ......................................... | 364/491 |
| 5,202,840 | 4/1993 | Wong .................................... | 364/490 |
| 5,566,078 | 10/1996 | Ding et al. ........................... | 364/490 |
| 5,659,717 | 8/1997 | Tse et al. ............................. | 395/500 |
| 5,682,321 | 10/1997 | Ding et al. ........................... | 364/490 |

FOREIGN PATENT DOCUMENTS 6-274570  9/1994  Japan .

*Primary Examiner*—James P. Trammell
*Assistant Examiner*—Leigh Marie Garbowski
*Attorney, Agent, or Firm*—McDermott, Will & Emery

[57] ABSTRACT

There are provided a circuit-graph producing step of representing a circuit by using a graph, a select-parameter determining step of determining a select parameter indicating the number of nodes to be combined with each other and moved together between initial blocks generated by initial partitioning of the circuit, a partition optimizing step of performing optimized partitioning by moving selected nodes grouped in numbers equal to or smaller than the value of the select parameter such that the number of edges between initial blocks is minimized, and a blocking step of partitioning the circuit such that the resulting blocks of the circuit correspond to the individual blocks of the optimized graph containing the respective selected nodes. In the select-parameter determining step, the select parameter is determined by calculating the total number of node combinations by using the selected nodes and repeatedly adding 1 to the select parameter till the total number of node combinations exceeds a specified value.

15 Claims, 23 Drawing Sheets

CIRCUIT PARTITIONING METHOD, CIRCUIT PARTITIONING APPARATUS, AND COMPUTER-READABLE RECORDING MEDIUM HAVING THEREON CIRCUIT PARTITIONING PROGRAM

BACKGROUND OF THE INVENTION

The present invention relates to a method and apparatus for automatically partitioning a circuit in circuit design for LSI.

As a conventional method of partitioning a circuit in circuit design for LSI, there has been known one discussed in the 179th to 210th sections of "HIGH-LEVEL SYNTHESIS" written by Daniel Gajski, Nikil Dutt, Allen Wu, and Steve Lin, in which initial partitioning of a circuit is followed by temporary movement of one or more circuit elements from one block to another and calculation of the number of nets connecting the blocks to each other. The method enables to improve initial partitioning by actually performing such movement as to minimize the number of nets connecting the blocks. The term "net" is defined here as a signal line connecting elements or terminals to be logically connected.

To minimize the value given by (Number of Edges Contained in Cluster)—(Number of Edges Extending Outwardly from Cluster), the conventional method of initial partitioning also performs repeated clustering with respect to nodes and cuts a clustering tree generated by repeated clustering.

However, the conventional method of partitioning a circuit has the problem of longer processing time due to a large number of combinations formed by the circuit elements to be temporarily moved. Moreover, since the processing time cannot be estimated in advance, and the processing time and the result of execution are contradictory to each other, it is difficult to provide a satisfactory compromise between the processing time and the result of execution.

Additionally, the conventional method of partitioning a circuit also has the problem of great difference among block sizes.

To partition a graph consisting of six nodes shown in FIG. 28 into three blocks, e.g., initial clustering is performed with respect to the first and second nodes n201 and n202 to generate a cluster c210 as shown in FIG. 29($a$). Then, as shown in FIGS. 29($b$) to 2($d$), the third, fourth, fifth, and sixth nodes n203, n204, n205, and n206 are sequentially clustered to be assigned to the cluster c210, thereby generating the clustering tree shown in FIG. 30($a$). The graph is partitioned into three blocks as shown in FIG. 30($b$) by cutting the clustering tree at the portions indicated by the two dash-dot lines. However, although the block 1 contains four nodes therein, each of the blocks 2 and 3 contains only one node therein.

SUMMARY OF THE INVENTION

The present invention has been achieved to overcome the foregoing conventional problems. It is therefore a first object of the present invention to permit such circuit partitioning as to minimize the number of connections between blocks in circuit design for LSI. A second object of the present invention is to permit initial partitioning of a circuit into blocks of equal dimensions.

To attain the above first object, the present invention provides a method of partitioning, into a plurality of blocks, a circuit composed of a plurality of circuit elements and a plurality of connecting elements for connecting the circuit elements to each other, comprising: a circuit-graph producing step of producing a graph having nodes representing the plurality of circuit elements and a plurality of edges representing the connecting elements; an initial-partitions generating step of partitioning the graph into an appropriate number of blocks and thereby generating initial blocks; a seed-node-set generating step of designating, as seed nodes, those of the nodes which are adjacent to each other and contained in different initial blocks and selecting at least one of the seed nodes to generate a set of seed nodes; a select-parameter determining step of determining a select parameter indicating the number of nodes to be combined with each other and moved together between the initial blocks; an optimizing step of moving nodes including at least one of the seed nodes grouped in numbers equal to or smaller than the value of the select parameter to the same initial block and thereby reducing the number of edges extending between the initial blocks; and a blocking step of partitioning the circuit into blocks such that the resulting blocks of the circuit correspond to the individual blocks of the optimized graph each composed of one or more nodes.

In accordance with the circuit partitioning method, the select parameter indicating the number of nodes to be combined with each other and moved together between the initial blocks has been introduced to place the upper limit on the total number of combinations that can be moved, so that processing time is reduced. Moreover, since the seed nodes adjacent to each other and contained in different initial blocks are sequentially moved and assigned to the same initial block, the combination of nodes which minimizes the number of inter-block edges can be obtained efficiently. Consequently, optimization is achieved whereby the number of connections between circuit blocks is minimized after the partitioning of the circuit.

In the circuit partitioning method, the select-parameter determining step preferably includes the steps of: initializing the select parameter; and selecting the seed nodes in the number indicated by the select parameter from the set of seed nodes, calculating the total number of node combinations formed by using the seed nodes, repeatedly performing the process of adding 1 to the select parameter till the total number of combinations exceeds a specified value, and thereby determining the select parameter. By examining the total number of node combinations while increasing the select parameter in accordance with the method, the select parameter with which the total number of node combinations becomes close to a desired specified value can surely be obtained. Moreover, both the processing time for partitioning and the result thereof can be controlled by updating the above specified value.

In the circuit partitioning method, the select-parameter determining step preferably includes the step of calculating the total number of pins which is the total of the number of edges connected to a node and designating a natural number closest to a logarithmic value of the total number of pins as the select parameter. Since the select parameter has thus been obtained by using a logarithmic function, there can be prevented an exponential increase in the number of combinations in a large-scale circuit, which provides the result of partitioning with an optimum number of inter-block edges in a short period of time. Moreover, since the select parameter can be determined in accordance with the scale of the circuit, selection is made among a large number of node combinations to provide one that minimizes the number of inter-block edges in a large-scale circuit, while the number of combinations can be reduced in a small-scale circuit, resulting in shorter processing time.

In the circuit partitioning method, the optimizing step preferably includes: a seed-node selecting step of selecting, as a current node, one seed node from the set of seed nodes to generate a set of selected nodes containing the current node as an element; an evaluation-function-value obtaining step of designating, when all nodes of the set of selected nodes are temporarily moved to the same initial block, the number of edges extending between the initial blocks as an evaluation function value; an optimum-value updating step of designating the set of selected nodes as a minimum set of selected nodes and designating the initial block which all nodes of the set of selected nodes were temporarily moved to as an optimum block when the evaluation function value is a minimum value; a first repeating step of repeatedly performing, when the number of nodes in the set of selected nodes does not exceed the select parameter, an adjacent-node selecting step of selecting one node adjacent to the current node, designating the selected node as a new current node, and adding the current node to the set of selected nodes, the evaluation-function-value obtaining step, and the optimum-value updating step; and a second repeating step of repeatedly performing, when the number of nodes in the set of selected nodes exceeds the select parameter, a partition altering step of moving the minimum set of selected nodes to the optimum block, the seed-node selecting step, the evaluation-function-value obtaining step, and the optimum-value updating step till all the seed nodes in the set of seed nodes are successively and thoroughly selected. In accordance with the method, when one node is selected from the set of seed nodes and designated as the current node to generate the set of selected nodes containing the current node as an element and all nodes of the set are moved and assigned to the specific initial block, the number of edges connecting nodes of different initial blocks is designated as the evaluation function value, while the number of nodes of the set is repeatedly increased by one and the nodes of the set are moved till the value of the select parameter is reached. Consequently, the result of partitioning with the optimum number of inter-block edges can surely be obtained in a short period of time.

In the circuit partitioning method, the optimizing step preferably includes: a seed-node selecting step of selecting, as a current node, one seed node from the set of seed nodes to generate a set of selected nodes containing the current node as an element; a select-parameter adjusting step of calculating the number of nodes lying on a path composed of the nodes and edges alternately arranged and connected to each other, the path starting from the current node and having a length equal to or smaller than a given value, and increasing or decreasing the select parameter depending on the number of the nodes; an evaluation-function-value obtaining step of obtaining, when the selected nodes have temporarily been moved and assigned to the same block, an evaluation function value from an evaluation function for evaluating partitioning after the movement; an optimum-value updating step of designating the set of selected nodes as a minimum set of selected nodes and designating the block containing the selected nodes as an optimum block when the evaluation function value is a minimum value; a first repeating step of repeatedly performing, when the number of nodes in the set of selected nodes does not exceed the select parameter, an adjacent-node selecting step of selecting one node adjacent to the current node, designating the selected node as a new current node, and adding the current node to the set of selected nodes, the select-parameter adjusting step, the evaluation-function-value obtaining step, and the optimum-value updating step; and a second repeating step of repeatedly performing, when the number of nodes in the set of selected nodes exceeds the select parameter, a partition altering step of moving the minimum set of selected nodes to the optimum block, the seed-node selecting step, the select-parameter adjusting step, the evaluation-function-value obtaining step, and the optimum-value updating step till all the seed nodes in the set of seed nodes are successively and thoroughly selected. In the accordance with the method, one node is selected from the set of seed nodes and designated as the current node to generate the set of selected nodes containing the current node as an element and the number of connected nodes lying on a path starting from the current node and having a length equal to or smaller than a predetermined value is calculated. If the current node has a large number of adjacent nodes, the selection parameter is reduced. If the current node has a small number of adjacent nodes, the select parameter is increased. Consequently, when the current node has a large number of adjacent nodes, the processing time can further be shortened by reducing the select parameter and thereby reducing the total number of combinations. On the other hand, when the current node has a small number of adjacent nodes, optimization is achieved by increasing the select parameter and thereby increasing the number of nodes that can be moved such that the number of inter-block edges is minimized.

In the circuit partitioning method, the number of edges extending between the blocks is preferably designated as the evaluation function. The method surely reduces the number of connections between the blocks of the circuit.

In the circuit partitioning method, the graph produced in the circuit-graph producing step is preferably a directed graph having an edge directed from a starting point to an end point and the optimizing step preferably includes: a seed-node selecting step of selecting, as a current node, one seed node from the set of seed nodes to generate a set of selected nodes containing the current node as an element; a first partition altering step of moving and assigning the selected nodes to the same block; an evaluation-function-value obtaining step of designating, as the number of output pins, the number of nodes each having an edge starting therefrom and terminating at another node contained in a different initial block which does not contain the starting node and providing the number of output pins as an evaluation function value; an optimum-value updating step of designating the set of selected nodes as a minimum set of selected nodes and designating the initial block containing the selected nodes as an optimum block when the evaluation function value is a minimum value; a partition cancelling step of returning the current node moved in the first partition altering step to the original initial block; a first repeating step of repeatedly performing, when the number of nodes in the set of selected nodes does not exceed the select parameter, an adjacent-node selecting step of selecting one node adjacent to the current node, designating the selected node as a new current node, and adding the current node to the set of selected nodes, the first partition altering step, the evaluation-function-value obtaining step, the optimum-value updating step, and the partition cancelling step; and a second repeating step of repeatedly performing, when the number of nodes in the set of selected nodes exceeds the select parameter, a partition altering step of moving the minimum set of selected nodes to the optimum block, the seed-node selecting step, the first partition altering step, the evaluation-function-value obtaining step, the optimum-value updating step, and the partition cancelling step till all the seed nodes in the set of seed nodes are successively and thoroughly selected. In accordance with the method, the graph produced in the circuit-graph producing step is represented by using a directed graph having an edge extending from the starting point to the end point. Of the plurality of nodes, the number of nodes having edges starting therefrom and terminating at other nodes contained in different initial blocks which do not contain the starting nodes is designated as the number of output pins, which in turn is provided as the evaluation function value, so that an optimum value reliably reflecting the number of nets in the circuit is obtained.

In the circuit partitioning method, the evaluation function value in the evaluation-function-value obtaining step is preferably provided by adding, to the number of output pins, the number of input pins obtained by counting, for each of the starting nodes having edges extending therefrom and terminating at other nodes contained in different initial blocks which do not contain the starting nodes, the number of different initial blocks containing the terminal nodes at which the edges extending from the starting nodes terminate and not containing the starting nodes and adding up the numbers of different initial blocks counted for all of the starting nodes. The method provides the optimum value for partitioning which reliably reflects the number of pins in the circuit.

In the circuit partitioning method, the graph produced in the circuit-graph producing step is preferably a directed graph having an edge extending from a starting point to an end point and the optimizing step preferably includes: a seed-node selecting step of selecting, as a current node, one seed node from the set of seed nodes to generate a set of selected nodes containing the current node as an element; a pin-number-calculation-set generating step of generating a set of nodes for pin number calculation composed of all nodes in the set of selected nodes and all nodes adjacent to at least one current node in the set of selected nodes; an input/output-pin-number obtaining step of calculating a first number of input/output pins which is the sum of the number of output pins corresponding to the number of nodes contained in the set of nodes for pin number calculation and having edges starting therefrom and terminating at other nodes contained in different initial blocks which do not contain the starting nodes and also in the set of nodes for pin number calculation and the number of input pins obtained by counting, for each of the starting nodes contained in the set of nodes for pin number calculation and having edges starting therefrom and terminating at other nodes contained in different initial blocks which do not contain the starting nodes and also in the set of nodes for pin number calculation, the number of different initial blocks containing the terminal nodes at which the edges extending from the starting nodes terminate and not containing the starting nodes and adding up the numbers of different initial blocks counted for all of the starting nodes; a first partition altering step of moving and assigning, the selected nodes to the same initial block and performing the input-output-pin-number obtaining step to obtain a second number of input/output pins which is the number of input/output pins after the movement; an evaluation-function-value obtaining step of designating the difference between the first number of input/output pins and the second number of input/output pins as an evaluation function value; an optimum-value updating step of designating the set of selected nodes as a minimum set of selected nodes and designating the initial block containing the selected nodes as an optimum block when the evaluation function value is a minimum value; a partition cancelling step of returning the selected nodes moved in the first partition altering step to the original initial block; a first repeating step of repeatedly performing, when the number of nodes in the set of selected nodes does not exceed the select parameter, an adjacent-node selecting step of selecting one node adjacent to the current node, designating the selected node as a new current node, and adding the current node to the set of selected nodes, the input-output-pin-number obtaining step, the first partition altering step, the evaluation-function-value obtaining step, the optimum-value updating step, and the partition cancelling step; and a second repeating step of repeatedly performing, when the number of nodes in the set of selected nodes exceeds the select parameter, a partition altering step of moving the minimum set of selected nodes to the optimum block, the seed-node selecting step, the pin-number-calculation-set generating step, the input/output-pin-number obtaining step, the first partition altering step, the evaluation-function-value obtaining step, the optimum-value updating step, and the partition cancelling step till all the seed nodes in the set of seed nodes are successively and thoroughly selected. In accordance with method, the graph produced in the circuit-graph producing step is represented by using a directed graph having an edge extending from the starting point to the end point and the set of nodes for pin number calculation composed of the selected nodes and at least one node adjacent to the current node has been produced. Accordingly, there is no more need for calculating the number of input/output pins in the whole circuit, which increases processing speed for partitioning and enables reliable calculation of a variation in the number of pins accompanying altered partitioning.

In the circuit partitioning method, the optimizing step preferably includes: a seed-node selecting step of selecting, as a current node, one seed node from the set of seed nodes to generate a set of selected nodes containing the current node as an element; an on-alteration block-ratio calculating step of calculating, when the selected nodes have temporarily been moved and assigned to the same block, a post-movement ratio which is a ratio of the number of nodes contained in the original block to the number of nodes contained in the destination block before the movement and a pre-movement ratio which is a ratio of the number of nodes contained in the original block to the number of nodes contained in the destination block after the movement and comparing the post-movement ratio with the pre-movement ratio; an evaluation-function-value obtaining step of evaluating the number of inter-block edges extending between the original block and the destination block after the movement when the post-movement ratio is closer to 1 than the pre-movement ratio; an optimum-value updating step of designating the set of selected nodes as a minimum set of selected nodes and designating the block containing the selected nodes as an optimum block when the evaluation function value is a minimum value; a first repeating step of repeatedly performing, when the number of nodes in the set of selected nodes does not exceed the select parameter, an adjacent-node selecting step of selecting one node adjacent to the current node, designating the selected node as a new current node, and adding the current node to the set of selected nodes, the on-alteration block-ratio calculating step, the evaluation-function-value obtaining step, and the optimum-value updating step; and a second repeating step of repeatedly performing, when the number of nodes in the set of selected nodes exceeds the select parameter, a partition altering step of moving the minimum set of selected nodes to the optimum block, the seed-node selecting step, the on-alteration block-ratio calculating step, the evaluation-function-value obtaining step, and the optimum-value updating step till all the seed nodes in the set of seed nodes are successively and thoroughly selected. In accordance with the method, the ratio between the number of nodes in the blocks on altering partitioning is examined and the number of inter-block edges after alteration is examined only when the examined ratio is closer to 1, so that the circuit is partitioned into blocks of equal dimensions even when partitioning has been altered and the number of inter-block edges is reduced.

To attain the above second object, the present invention provides a method of partitioning, into a plurality of blocks, a circuit composed of a plurality of circuit elements and connecting elements for connecting the circuit elements to each other, comprising: a circuit-graph producing step of producing a graph having nodes representing the plurality of circuit elements and edges representing the connecting elements; a cluster generating step of performing clustering of the nodes based on a desired number of partitions and thereby generating clusters; a block generating step of generating, as a block, at least one of the clusters; a graph updating step of deleting, from the graph, the nodes contained in the block and the edges connected to the node; a repeating step of repeatedly performing the cluster generating step, the block generating step, and the graph updating step till the portion of the graph remaining after the deletion is completely deleted; and a blocking step of partitioning the circuit into blocks such that the blocks of the circuit correspond to the blocks generated in the block generating step.

In accordance with the above circuit partitioning method, clustering is performed based on the desired number of blocks to provide blocks of the graph having equal dimensions, thereby partitioning the circuit into blocks of equal dimensions.

The present invention also provides a method of partitioning, into a plurality of blocks, a circuit composed of a plurality of circuit elements and connecting elements for connecting the circuit elements to each other, comprising: a circuit-graph producing step of producing a graph having nodes representing the plurality of circuit elements and edges representing the connecting elements; an inter-edge-node-number obtaining step of adding, if the edge on the graph is contained in a cluster in calculating the number of nodes connected to the edge, the dimension of the cluster as a weight to the number of nodes; a cluster generating step of generating clusters by selecting among combinations of clusters which provides a minimum number of inter-edge nodes and a desired number of partitions such that the number of edges between the clusters is minimized; a repeating step of repeatedly performing the inter-edge-node-number obtaining step and the cluster generating step till the graph is completely clustered; and a blocking step of partitioning the circuit into blocks such that the resulting blocks of the circuit correspond to the clusters.

In accordance with the above circuit partitioning method, clustering is performed such that the resulting clusters contain respective nodes connected to an edge with a minimum weight. Consequently, the cluster larger in weight than the node is inevitably removed in the subsequent clustering, so that clusters are generated without subjecting existing clusters to clustering again. Moreover, since selection is made from the generated clusters such that the number of edges between the clusters is minimized, the blocks obtained through partitioning have equal dimensions, while the number of connections between the individual blocks is reduced to achieve optimization.

The present invention provides an apparatus for partitioning, into a plurality of blocks, a circuit composed of a plurality of circuit elements and connecting elements for connecting the circuit elements to each other, comprising: circuit receiving means for receiving a circuit to be partitioned; graph producing means for producing a graph having nodes representing the plurality of circuit elements and edges representing the connecting elements; initial graph partitioning means for partitioning the graph into an appropriate number of blocks and thereby generating initial blocks; select-parameter determining means for determining a select parameter indicating the number of nodes to be combined with each other; combination-number calculating means for calculating the total number of possible combinations with respect to the value of the select parameter; processing-time calculating means for calculating, from the total number of combinations, processing time required to partition the graph; processing-time outputting means for outputting the processing time; graph partitioning means for optimumly partitioning the graph by moving the nodes grouped in numbers equal to or smaller than the value of the select parameter to the same initial block; circuit partitioning means for partitioning the circuit such that the partitioned circuit corresponds to the partitioned graph; and circuit outputting means for outputting the partitioned circuit.

In the above apparatus for partitioning a circuit, the select parameter indicating the number of nodes to be combined with each other and moved together between the initial blocks has been introduced to place the upper limit on the total number of combinations that can be moved between the initial blocks. Moreover, since the nodes grouped in numbers equal to or smaller than the value of the select parameter are moved and assigned to the same initial block, there can be obtained the combinations of nodes that minimize the number of inter-block edges. Consequently, there can be achieved optimization whereby the number of connections between the blocks of the circuit is minimized in a short period of time.

The present invention also provides an apparatus for partitioning, into a plurality of blocks, a circuit composed of a plurality of circuit elements and connecting elements for connecting the circuit elements to each other, comprising: circuit receiving means for receiving a circuit to be partitioned; graph producing means for producing a graph having nodes representing the plurality of circuit elements and edges representing the connecting elements; initial graph partitioning means for partitioning the graph into an appropriate number of blocks and thereby generating initial blocks; processing-time receiving means for receiving processing time required to optimize the graph; combination-number back calculating means for calculating, when the nodes appropriately combined with each other are moved to the same initial block to improve the partitioning of the graph, the total number of combinations that can be moved within the processing time; select-parameter determining means for determining a select parameter indicating the number of nodes to be combined with each other which has been calculated from the total number of combinations; graph partitioning means for optimumly partitioning the graph by moving and assigning the nodes grouped in numbers equal to or smaller than the value of the select parameter to the same initial block; circuit partitioning means for partitioning the circuit such that the partitioned circuit corresponds to the partitioned graph; and circuit outputting means for outputting the partitioned circuit.

Since the specific processing time required for partitioning can be supplied previously to the above apparatus for partitioning a circuit, the select parameter appropriate for the processing time is determined. Moreover, since the nodes grouped in a number equal to or smaller than the value of the select parameter are moved and assigned to the same initial block, the combinations of nodes that minimize the number of inter-block edges can be obtained within a desired period of time. Hence, there can be achieved optimization whereby the number of combinations between the blocks of the circuit is minimized in a desired period of time.

The present invention provides a computer-readable recording medium having thereon a program for partitioning, into a plurality of blocks, a circuit composed of a plurality of circuit elements and connecting elements for connecting the circuit elements to each other, the program performing: a circuit-graph producing procedure of producing a graph having nodes representing the plurality of circuit elements and edges representing the connecting elements; an initial-partitions generating procedure of partitioning the graph into a plurality of blocks and thereby generating initial blocks; a seed-node-set generating procedure of designating, as seed nodes, those of the nodes which are adjacent to each other and contained in different initial blocks and selecting at least one of the seed nodes to generate a set of seed nodes; a select-parameter determining procedure of determining a select parameter indicating the number of nodes to be combined with each other and moved together between the initial blocks; an optimizing procedure of reducing the number of edges extending between the initial blocks by moving and assigning the selected nodes grouped in numbers equal to or smaller than the value of the select parameter to the same initial block; and a blocking procedure of blocking the circuit such that the resulting blocks of the circuit correspond to the individual blocks of the optimized graph each composed of one or more nodes including the seed node.

In accordance with the above program for partitioning a circuit recorded on the computer-readable recording medium, the select parameter has been introduced to place the upper limit on the total number of combinations that can be moved, so that processing time is shortened. Moreover, since the seed nodes adjacent to each other and belonging to different initial blocks are successively moved and assigned to the same initial block, the combination of nodes that minimizes the number of inter-block edges can be obtained efficiently, which enables optimization whereby the number of connections between circuit blocks is minimized after partitioning of the circuit.

BRIEF DESCRIPTION OF THE DRAWINGS

FIGS. 24(a) to 24(d) show a sequence of operations performed in individual process steps in the circuit partitioning method according to the sixth embodiment of the present invention, of which FIG. 24(a) is a graphical representation of a part of the circuit to be partitioned, FIG. 24(b) illustrates clustering performed with respect to the graph shown in FIG. 24(a), FIG. 24(c) illustrates clustering performed with respect to the graph shown in FIG. 24(b), and FIG. 24(d) illustrates clustering performed with respect to the graph shown in FIG. 24(c);

FIGS. 26(a) to 26(c) show a sequence of operations in individual process steps in the circuit partitioning method according to the seventh embodiment of the present invention, of which FIG. 26(a) illustrates clustering performed with respect to a graph representing a part of the circuit to be partitioned, FIG. 26(b) illustrates clustering performed with respect to the graph shown in FIG. 26(a), and FIG. 26(c) illustrates clustering performed with respect to the graph shown in FIG. 26(b);

FIGS. 29(a) to 29(d) show a sequence of operations in individual process steps in accordance with the conventional circuit partitioning method, of which FIG. 29(a) illustrates clustering performed with respect to a graph representing the part of the circuit to be partitioned, FIG. 29(b) illustrates clustering performed with respect to the graph shown in FIG. 29(a), FIG. 29(c) illustrates clustering performed with respect to the graph shown in FIG. 29(b), and FIG. 29(d) illustrates clustering performed with respect to the graph shown in FIG. 29(c); and FIGS. 30(a) and 30(b) illustrate a sequence of operations in individual process steps in the conventional circuit partitioning method, of which FIG. 30(a) shows a clustering tree resulting from clustering performed with respect to the graph and FIG. 30(b) is a graphical representation of the graph which has been clustered and blocked.

Figure 1:
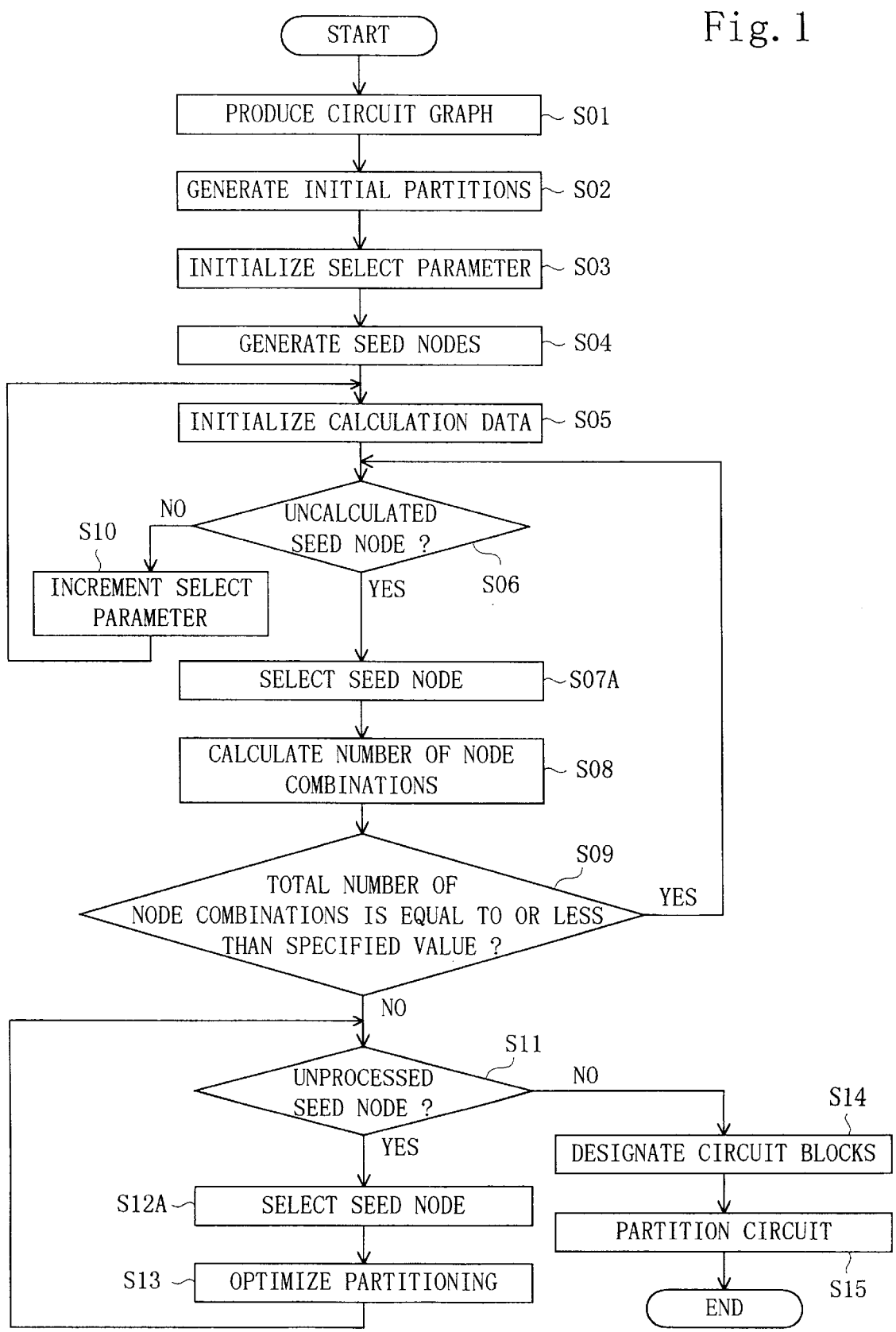
FIG. 1 shows a process flow in a method of partitioning a circuit according to a first embodiment of the present invention.

DETAILED DESCRIPTION OF THE INVENTION (First Embodiment)

Referring now to the drawings, a first embodiment of the present invention will be described.

FIG. 1 shows a process flow in a method of partitioning a circuit according to the first embodiment of the present invention. As shown in the drawing, a graph representing the circuit to be partitioned is produced in a circuit-graph producing step S01 by causing cells as circuit elements to correspond to nodes and causing nets as circuit connecting elements to correspond to edges. Then, initial partitioning is performed in an initial-partitions generating step S02, whereby the graph is partitioned into a plurality of blocks. The blocks obtained by initial partitioning form initial blocks, which will be simply referred to as initial blocks provided that no confusion occurs.

Next, in a select-parameter initializing step S03, a select parameter indicating the number of nodes to be combined with each other and moved together between blocks is expressed as a variable natural number k. After k=1 is satisfied by initialization, those of the plurality of nodes which are adjacent to each other and contained in different blocks are designated as seed nodes in a seed-node-set generating step S04 and at least one of the seed nodes is selected to generate a set of selected nodes.

Next, in a calculation-data initializing step S05, data representing whether or not each node in the set of seed nodes has been processed in a node-combination-number calculating step S08 as well as the total number of seed combinations formed in accordance with the select parameter, which is calculated in the node-combination-number calculating step S08, is initialized.

Next, in an uncalculated-seed-node judging step S06, it is judged whether or not there is any node in the set of seed nodes that has not undergone the node-combination-number calculating step S08. If there is any uncalculated node, one uncalculated seed node is selected from the set of seed nodes in a first seed-node selecting step S07A and designated as a current node.

Next, in the node-combination-number calculating step S08, the total number of node combinations each containing a seed node and consisting of k (indicated by the select parameter) nodes connected to each other is calculated, followed by judgment of whether or not the total number of node combinations calculated in the node-combination-number calculating step S08 exceeds a proper specified value in a node-combination-number judging step S09. If the specified value is not exceeded, the whole process returns to the uncalculated-seed-node judging step S06. If the specified value is exceeded, the whole process advances to an unprocessed-seed-node judging step S11.

If the specified value is not exceeded and there is no uncalculated seed node in the uncalculated-seed-node judging step S06, 1 is added to the select parameter k in a select-parameter increment step S10 and the whole process returns to the calculation-data initializing step S05.

If the specified value is exceeded, it is judged in the unprocessed-seed-node judging step S11 whether or not there is any seed node that has not undergone a partition optimizing step S13 as an optimizing step. If there is no unprocessed seed node, the whole process advances to a circuit-block designating step S14. If there is any unprocessed seed node, the whole process advances to a second seed-node selecting step S12A.

Next, in the second seed-node selecting step S12A, one seed node that has not undergone partition optimization is selected from the set of seed node and designated as a current node. Then, in the partition optimizing step S13, the (k−1) nodes including the seed node and connected to each other are temporarily moved from the original block to another block and the partitioning of the graph is evaluated such that the number of edges extending between the blocks (hereinafter referred to as the number of inter-block edges) is minimized, whereby partitioning is optimized.

Next, in the circuit-block designating step S14, blocking is performed with respect to the circuit whereby the individual blocks of the optimumly partitioned graph are caused to correspond to the individual blocks of the circuit in a one-to-one relationship. Then, in a circuit partitioning step S15 as a blocking step, the individual circuit elements are assigned to the circuit blocks corresponding to the individual graph blocks.

A detailed description will be given to the present embodiment by using specific data.

Figure 2:
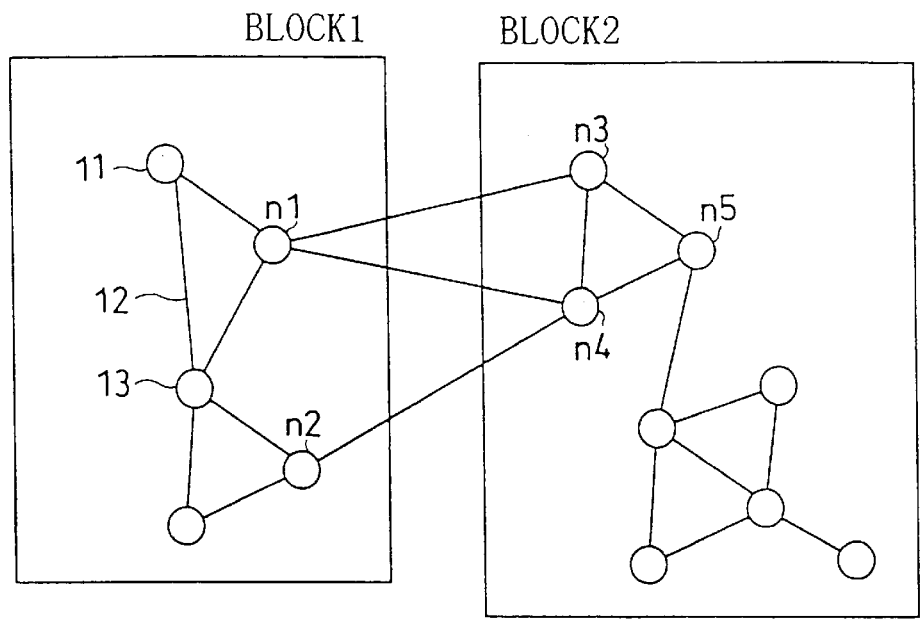
FIG. 2 is a graphical representation of the circuit to be partitioned according to the first embodiment of the present invention.
Figure 3:
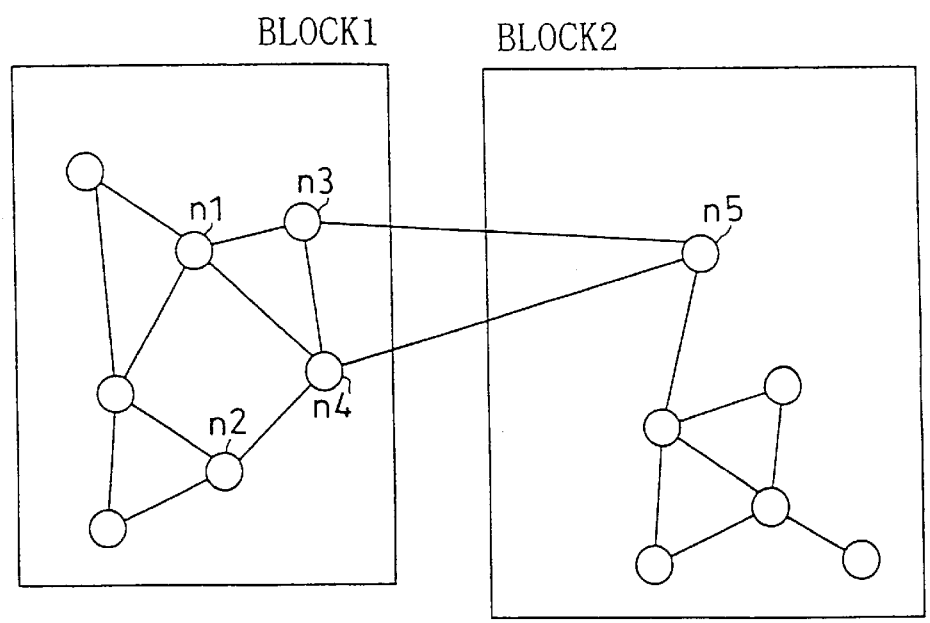
FIG. 3 is a graphical representation of the circuit excellently partitioned by the circuit partitioning method according to the first embodiment of the present invention.

FIG. 2 is a graphical representation of the circuit to be partitioned, in which are shown: nodes 11 and 13 graphically represented in the circuit-graph producing step S01; and an edge 12 for connecting the nodes to each other, which is also graphically represented in the circuit-graph producing step S01. The blocks 1 and 2 indicate that the graph has undergone initial partitioning in the initial-partitions generating step S02.

It is assumed first that the specified value for restricting the number of node combinations is 10.

After the select parameter is initialized to 1 in the select-parameter initializing step S03, a set of seed nodes containing the first, second, third, and fourth nodes n1, n2, n3, and n4 as seed nodes is generated since each of the first to fourth nodes n1 to n4 has an adjacent node belonging to a different block.

In the first seed-node selecting step S07A, the first node n1 that has not undergone the node-combination-number calculating step S08 is selected from the set of seed nodes.

Since the total number of combinations calculated in the node-combination-number calculating step S8 is 1, which is not exceeding the specified value of 10 in the subsequent node-combination-number judging step S09, the whole process returns to the uncalculated-seed-node judging step S06. Since there are uncalculated seed nodes remaining, the second node n2 that has not undergone the node-combination-number calculating step S08 is selected from the set of seed nodes in the first seed-node selecting step S07A.

The sequence of the uncalculated-seed-node judging step S06 to the node-combination-number judging step S09 are repeatedly performed so that each node in the set of seed nodes undergoes the node-combination-number calculating step S08. Thereafter, 1 is added to the select parameter in the select-parameter increment step S10 to provide 2.

Next, the first node n1 is selected in the first seed-node selecting step S07A and the number of combinations formed of two connected nodes including the first node n1 is calculated in the node-combination-number calculating step S08 to provide four combinations of (n1, 11) (n1, 13), (n1, n3) and (n1, n4).

The sequence of the uncalculated-seed-node judging step S06 to the node-combination-number judging step S09 are repeatedly performed so that each node in the set of seed nodes undergoes the node-combination-number calculating step S08. Since the total number of node combinations obtained is 10, 1 is added to the select parameter in the select-parameter increment step S10 to provide 3.

When the select parameter is 3, the total number of node combinations exceeds the specified value of 10, so that the select parameter indicating the number of nodes contained in each of the combinations compliant with the specified value of 10 is determined to be 3 and the whole process advances to the unprocessed-seed-node judging step S11.

Next, after the selection of the first node n1, e.g., in the second seed-node selecting step S12A, the value of the select parameter in the partition optimizing step S13 is 3 and the number of nodes to be moved together is 2 (obtained by subtracting 1 from the select parameter). If the first node n1 is combined with the third node n3, the third node n3 is temporarily moved from the block 2 to the first block 1 containing the first node n1 so that three inter-block edges (n3, n5), (n3, n4), and (n2, n4) are obtained. Since there were three inter-block edges (n1, n3), (n1, n4), and (n2, n4) before the movement, the number of the inter-block edges remains the same. If the third node n3 is selected as a current node, the third and fourth nodes n3 and n4 are temporarily moved from the block 2 to the block 1 in the partition optimizing step S13 so that two inter-block edges (n3, n5) and (n4, n5) are obtained. Since this is eventually the case where the minimum number is obtained, the third and fourth nodes n3 and n4 are actually moved from the block 2 to the block 1 to optimize the graph.

Next, in the circuit-block designating step S14, the circuit blocks 1 and 2 corresponding to the respective graph blocks 1 and 2 are designated. Then, in the circuit partitioning step S15, a circuit element corresponding to a node contained in the graph block 1 is assigned to the circuit block 1, while a circuit element corresponding to a node contained in the graph block 2 is assigned to the circuit block 2, which completes the partitioning of the circuit.

Although the foregoing circuit partitioning method has limited the specified value to 10 so as to reduce the number of node combinations to be temporarily moved, if there is sufficient time allowance for the process, a larger specified value will increase the value of the select parameter to 4 or more. With the select parameter of 4, three nodes can be moved at a time so that it is possible to reduce the number of inter-block edges to 1 by moving the third, fourth, and fifth nodes n3, n4, and n5 shown in FIG. 2 from the block 2 to the block 1.

Thus, the present embodiment has examined the total number of node combinations prior to the partition optimizing step S13, while increasing the select parameter, thereby obtaining the select parameter with which the total number of node combinations becomes close to the desired specified value. Accordingly, the number of nodes to be combined with each other can be determined such that processing time is not excessively elongated in the partition optimizing step S13 for obtaining the minimum number of inter-block edges, which enables the obtention of the result of partitioning with the optimum number of inter-block edges in a short period of time. Moreover, the processing time for partitioning and the result of processing can be controlled by changing the specified value.

It is also possible to produce a computer program in accordance with the circuit partitioning method according to the present embodiment and store the computer program on a computer-readable recording medium.

(Second Embodiment)

A second embodiment of the present invention will be described with reference to the drawings.

Figure 4:
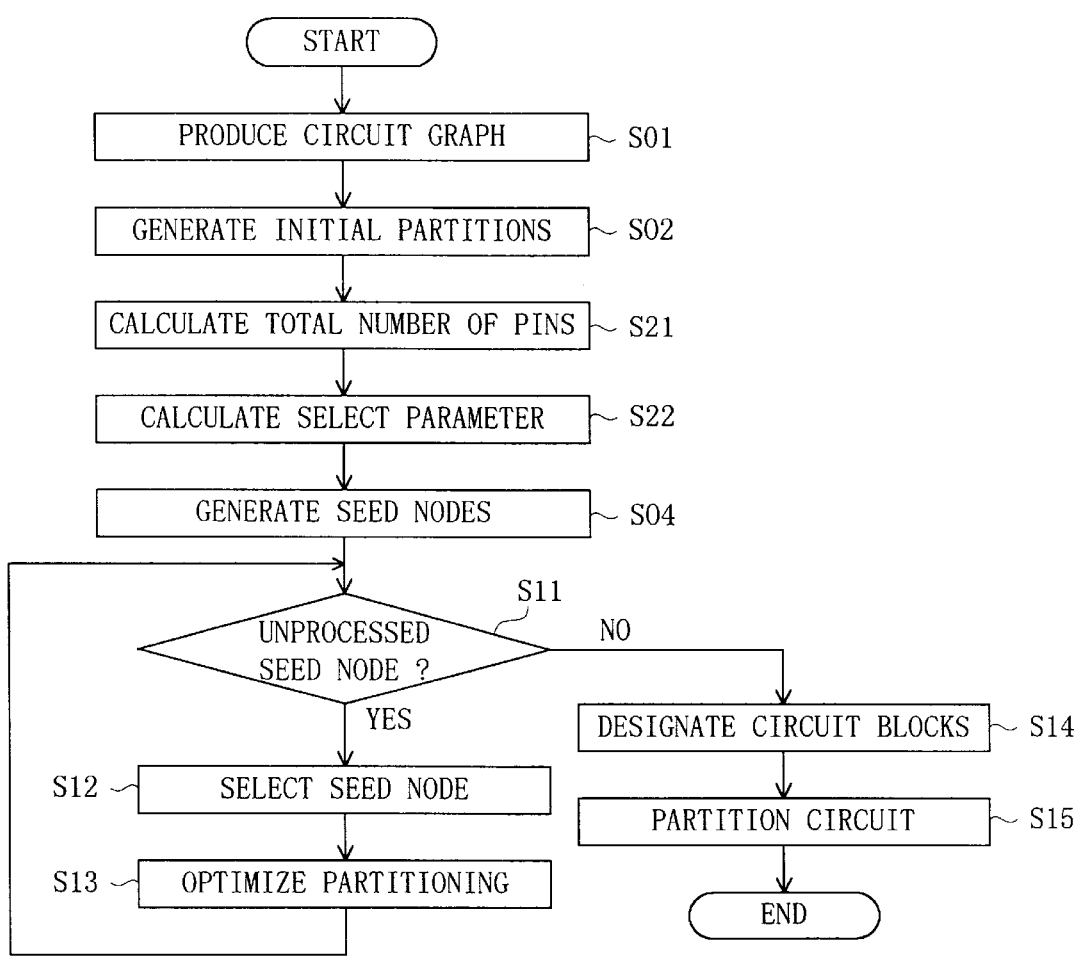
FIG. 4 shows a process flow in a method of partitioning a circuit according to a second embodiment of the present invention.

FIG. 4 shows a process flow in a method of partitioning a circuit according to a second embodiment of the present invention, in which like steps shown in FIG. 1 are designated by like reference numerals.

In the select-parameter determining step of the first embodiment, the select parameter has been determined by the six steps of the calculation-data initializing step S05 to the select-parameter increment step S10.

In the select-parameter determining step of the present embodiment, the total number of pins is calculated by adding up the number of edges connected to each of the nodes on the graph in a total-pin-number calculating step S21 subsequent to the initial-partitions generating step S02 and then a natural number closest to the value of the natural logarithm of the total number of pins is designated as the select parameter in a select-parameter calculating step S22.

The steps following the subsequent unprocessed-seed-node judging step S11 are the same as described in the first embodiment.

A detailed description will be given to the present embodiment by using specific data.

Figure 5:
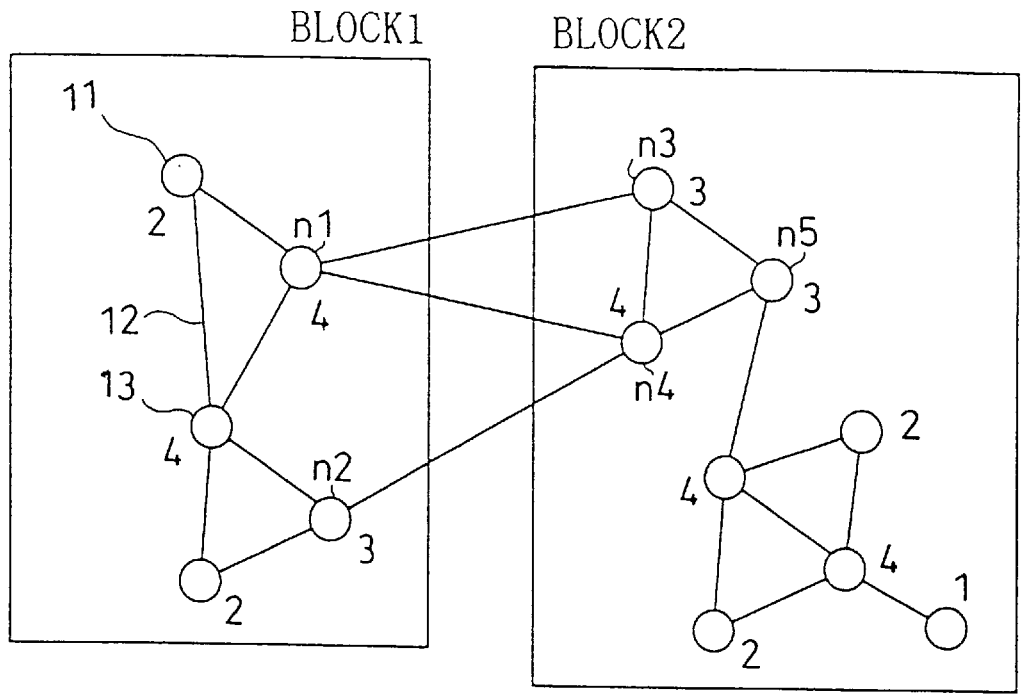
FIG. 5 is a graphical representation of the circuit to be partitioned according to the second embodiment of the present invention.

FIG. 5 is a graph representing a circuit to be partitioned, in which are shown: a node 11 graphically represented in the circuit-graph producing step S01; and an edge 12 also graphically represented in the circuit-graph producing step S01. The blocks 1 and 2 indicate that the graph has undergone initial partitioning in the initial-partitions generating step S02. On the graph shown in FIG. 5, the numeric characters accompanying the respective nodes indicate the number of edges connected thereto.

In partitioning the graph shown in FIG. 5, the total number of edges connected to the individual nodes is calculated to be 38 in the total-pin-number calculating step S21, so that a natural number 4 closest to 3.64 which is the natural logarithm of the total number 38 is designated as the select parameter. Accordingly, the third, fourth, and fifth nodes n3, n4, and n5 can be moved from the block 2 to the block 1 as described in the first embodiment.

Figure 6:
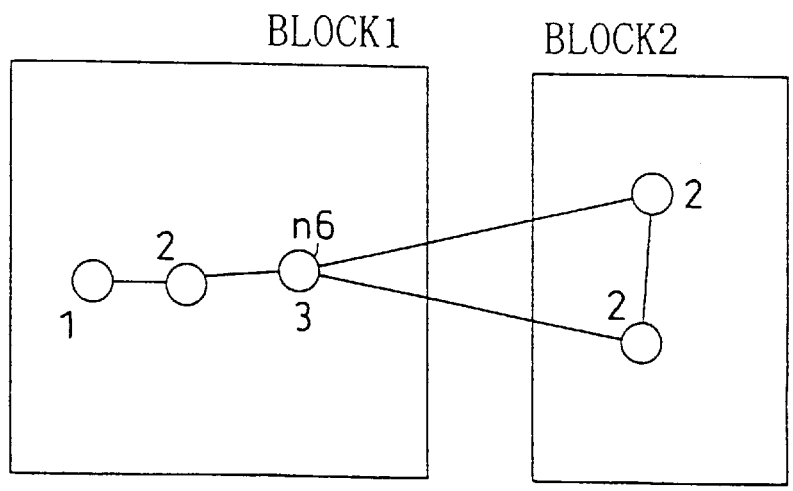
FIG. 6 is a graphical representation of the circuit to be partitioned according to the second embodiment of the present invention.

In the case of partitioning the graph shown in FIG. 6, the total number of edges connected to the individual nodes is 10 and the natural logarithm thereof is 2.3, so that the select parameter is 2. Since only one node is allowed to move between the blocks, the first node n6 which is the seed node is moved from the block 1 to the block 2, so that the number of inter-block edges is reduced from 2 to 1.

Thus, the present embodiment has determined the select parameter based on the scale of the graph, i.e., the scale of the circuit. Accordingly, selection can be made among numerous combinations of nodes such that the number of inter-block edges in a large-scale circuit is minimized, while processing time can be shortened by reducing the number of combinations in a small-scale circuit. On the other hand, the use of a logarithm to obtain the select parameter prevents an exponential increase in the number of combinations or in processing time in the large-scale circuit, which enables the result of partitioning with the optimum number of inter-block edges to be obtained in a short period of time.

(Third Embodiment)

A third embodiment of the present invention will be described with reference to the drawings.

Figure 7:
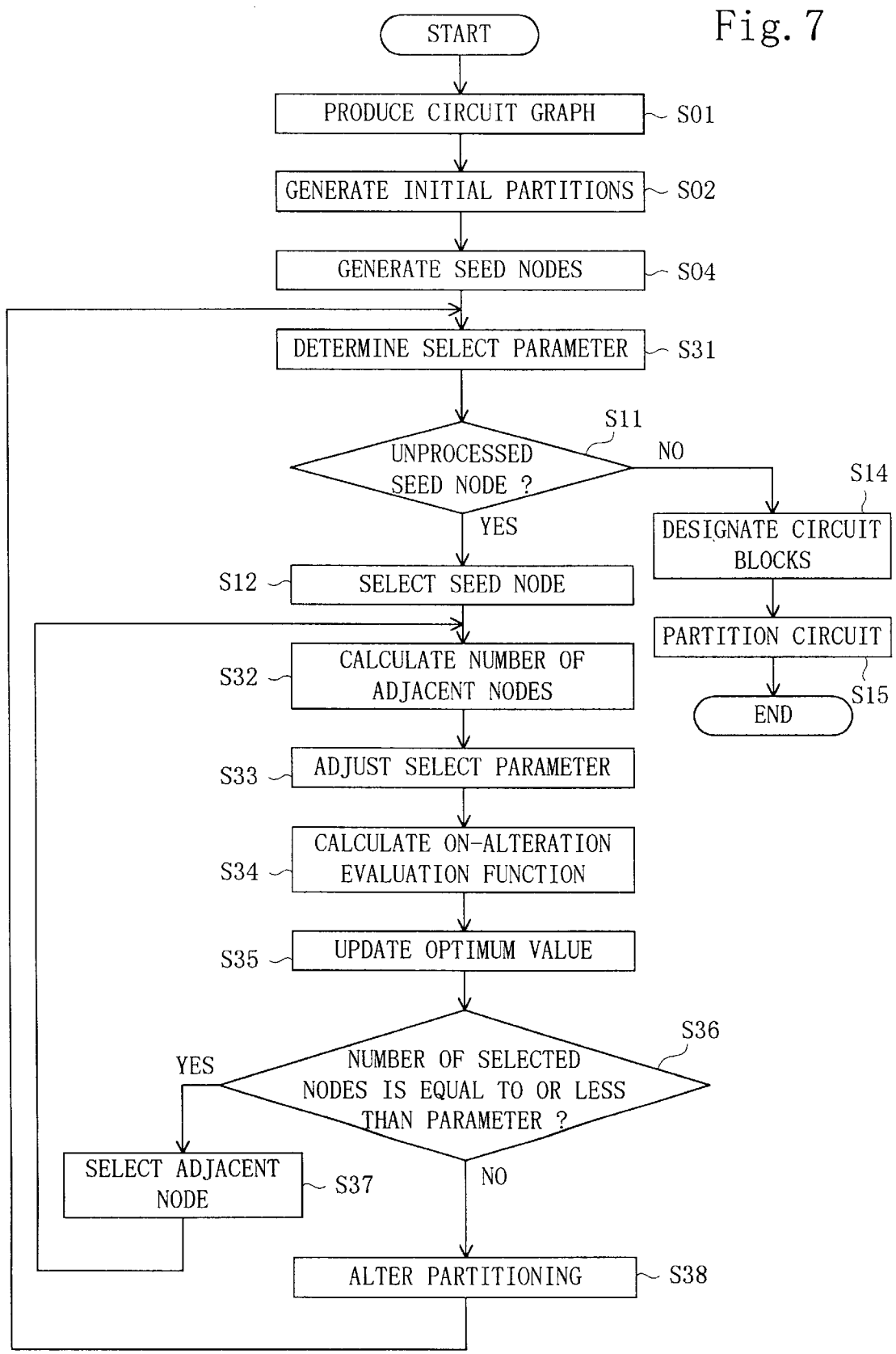
FIG. 7 shows a process flow in a method of partitioning a circuit according to a third embodiment of the present invention.

FIG. 7 shows a process flow in a method of partitioning a circuit according to the third embodiment of the present invention, in which the description of like steps shown in FIG. 1 illustrating the first embodiment will be omitted by providing like reference numerals.

As shown in FIG. 7, the circuit-graph producing steps S1, the initial-partitions generating step S02, and the seed-nodeset generating step S04 are followed by a select-parameter determining step S31 in which a proper natural number is designated as the select parameter.

Next, if there is any unprocessed seed node in the unprocessed-seed-node judging steps S11, one seed node is selected as a current node from the set of seed nodes in the seed-node selecting step S12 to generate a set of selected nodes containing the current node. Then, in an adjacent-node-number calculating step S32, the number of nodes adjacent to the current node is calculated.

Next, in a select-parameter adjusting step S33, 1 is added to the select parameter if the number of adjacent nodes calculated in the preceding adjacent-node-number calculating step S32 is 2 or 1 is subtracted from the select parameter if the number of adjacent nodes is 6 or more.

Next, in an on-alteration evaluation-function calculating step S34 as an evaluation-function-value obtaining step, the number of inter-block edges when all nodes in the set of selected node have been moved and assigned to the same block (select block) is calculated.

Next, in an optimum-value updating step S35, when the minimum number of edges has been initialized or if the number of edges calculated in the preceding on-alteration evaluation-function calculating step S34 is smaller than the previous minimum number, the number of inter-block edges is designated as the minimum number and the set of selected nodes is designated as the set of minimum selected nodes, while the select block is designated as the optimum block.

Next, in a selected-node-number judging step S36, it is judged whether or not the number of nodes in the set of selected nodes exceeds the select parameter. If the select parameter is not exceeded, one node adjacent to the current node is selected in an adjacent-node selecting step S37 and assigned to the set of selected nodes, while it is added to the current node. Then, the whole process returns to the adjacent-node-number calculating step S32. If the number of nodes in the set of selected nodes exceeds the select parameter, the set of minimum selected nodes are moved to the optimum block to initialize the minimum number of edges in a partition altering step S38. Then, the whole process returns to the select-parameter determining step S31. If there is no unprocessed seed node in the unprocessed-node judging step S11, predetermined processing is performed in the circuit-block designating step S14 and in the circuit partitioning step S15, thereby completing the partitioning of the circuit.

A detailed description will be given to the present embodiment by using specific data.

Figure 8:
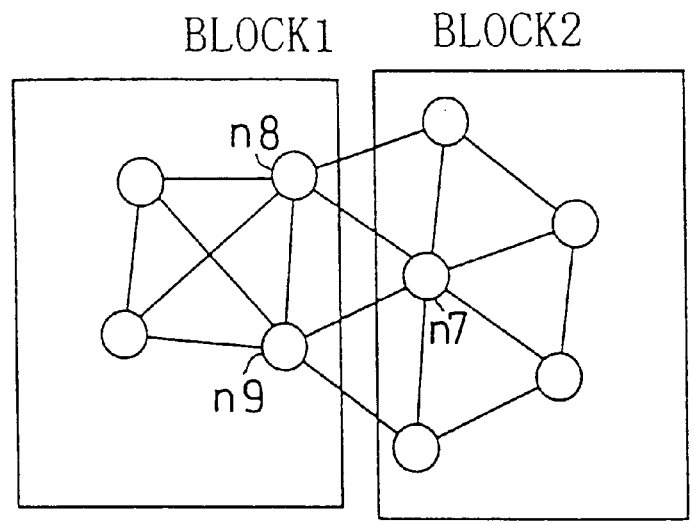
FIG. 8 is a graphical representation of a part of the circuit to be partitioned according to the third embodiment of the present invention.

FIG. 8 is a graphical representation of a part of the circuit to be partitioned.

It is assumed first that the select parameter has been determined to be 4 in the select-parameter determining step S31. Then, if the first node n7, e.g., is selected from the set of seed nodes in the seed-node selecting step S12, the number of all nodes adjacent to the first node n7 is calculated to be 6 in the subsequent adjacent-node-number calculating step S32, so that the select parameter is reduced from 4 to 3 in the select-parameter adjusting step S33 under the rule that 1 is subtracted from the total number of adjacent nodes when it is 6 or more.

There are six combinations of nodes each containing the first node n7 as the seed node and moved between the blocks so that the number of inter-block edges is evaluated. However, even if the combinations of nodes have been assigned to any block, the number of inter-block edges cannot be reduced.

If it is assumed that the select-parameter adjusting step S33 is not performed, there are nineteen combinations of nodes each having the first node n7 as the seed node and moved between the block so that the number of the inter-block edges is evaluated. However, even if the combinations of nodes are moved to any block, the number of inter-block edges cannot be reduced.

Thus, when the node having a large number of adjacent nodes is moved and the seed node has a large number of adjacent nodes contained in the same block, the number of the inter-block edges is less likely to decrease when the seed node is moved.

When the seed node contained in the select block is moved to a block containing another seed node, there is little merit in designating a node having a large number of adjacent nodes as the seed node since movement which results in the same combination can be performed when a node adjacent to the select block containing the first node n7 and contained in another block, such as the second node n8 or the third node n9 shown in FIG. 8, is designated as a current node.

Moreover, the current node having a large number of adjacent nodes increases the number of node combinations, which elongates processing time required by the step.

To prevent longer processing time, therefore, the select parameter is reduced in the select-parameter adjusting step S33 so that the number of node combinations is reduced.

Figure 9:
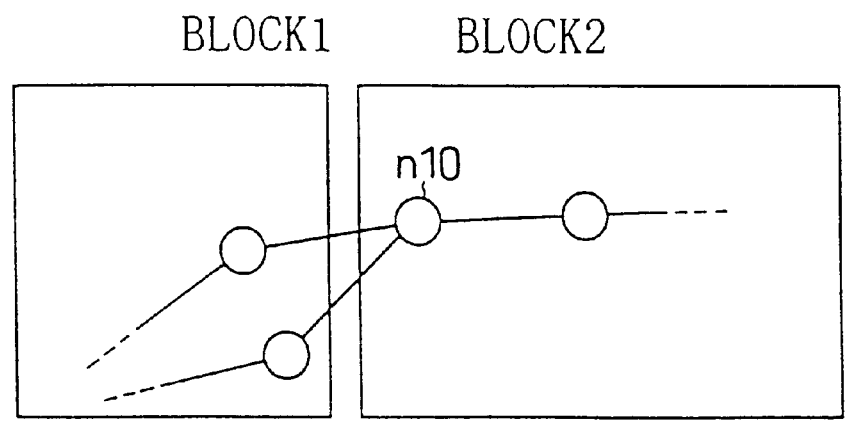
FIG. 9 is a graphical representation of the part of the circuit to be partitioned according to the third embodiment of the present invention.
Figure 10:
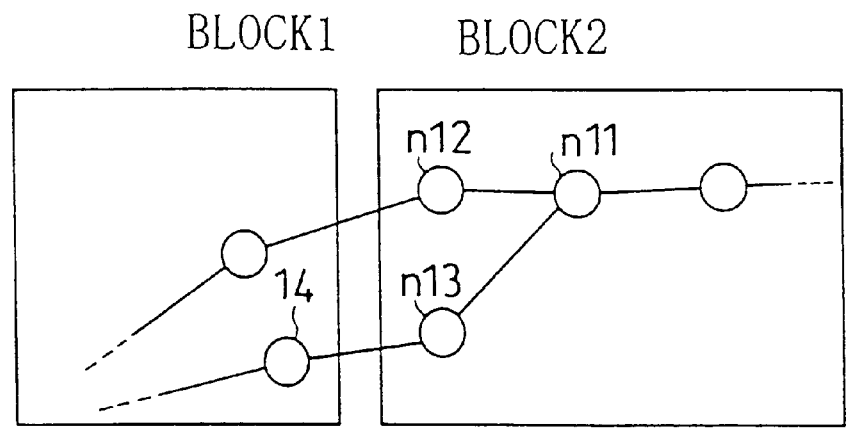
FIG. 10 is a graphical representation of the part of the circuit to be partitioned according to the third embodiment of the present invention.
Figure 11:
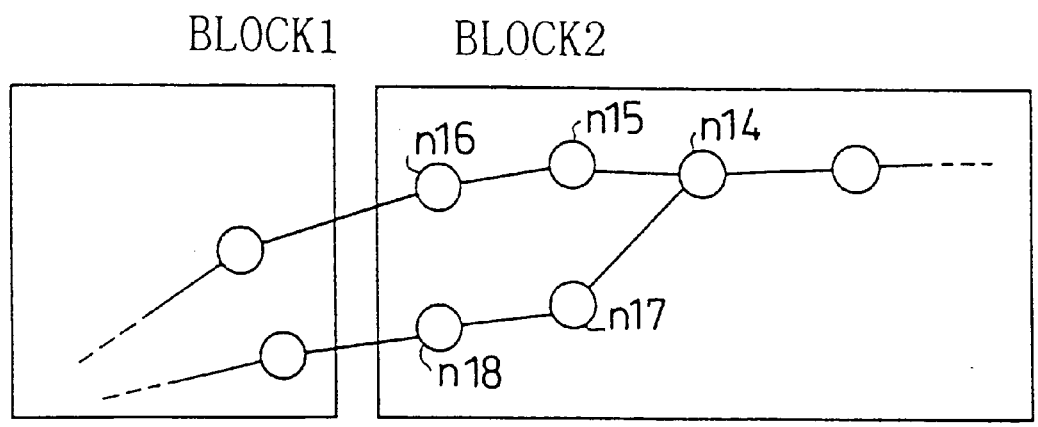
FIG. 11 is a graphical representation of the part of the circuit to be partitioned according to the third embodiment of the present invention.

In partitioning the graph shown in FIG. 9, 10, or 11, if the select parameter is determined to be 2, the number of inter-block edges can be reduced from 2 to 1 on the graph shown in FIG. 9 by moving the seed node n10 from the block 2 to the block 1. However, if no adjustment is made and the select parameter is not increased by one in the select-parameter adjusting step S33 when the number of adjacent nodes is 2, the number of inter-block edges on the graph shown in FIG. 10 or 11 cannot be reduced and remains 2.

A specific description will be given by using the graph shown in FIG. 10 as an example. In performing processing in the select-parameter adjusting step S33, if the select parameter is determined to be 2 in the select-parameter determining step S31, the number of adjacent nodes is 2 in the adjacent-node-number calculating step S32 so that 1 is added in the select-parameter adjusting step to provide 3. If the second node n12 which is the seed node is designated as a current node, the number of inter-block edges, which are (n12, n11) and (n13, 14) remains two even when the second node n12 is moved from the block 2 containing the second node n12 to the adjacent block 1. Since the number of the selected node is one and the value of the select parameter is 3 in the selected-node-number judging step S36, the first node n11 is selected in the subsequent adjacent-node selecting step S37 and assigned to the set of selected nodes. Next, the number of adjacent nodes is 2 in the adjacent-node-number calculating step S32 so that 1 is added again in the select-parameter adjusting step to provide 4. Even when the second node n12 and the first node n11 as current nodes in the set of selected nodes are moved to the block 1, the number of inter-block edges also remains two. Next, in the selected-node-number judging step S36, the number of selected nodes is 2 and the value of the select parameter is 4, so that the third node n13 which is the seed node is selected in the adjacent-node selecting step S37 and assigned, as a current node, to the set of selected nodes. Next, the number of adjacent nodes is 2 in the adjacent-node-number calculating step S32 so that 1 is added in the select-parameter adjusting step to provide 5. When the second, first, and third nodes n12, n11, and n13 as current nodes in the set of selected nodes are subsequently moved from the block 2 to the block 1, the number of inter-block edges is reduced to 1 and the optimum value is updated.

Similarly on the graph shown in FIG. 11, the select parameter is also increased by one when the first, second, third, fourth, and fifth nodes n14, n15, n16, n17, and n18 are designated as current nodes. Consequently, they can be moved simultaneously from the block 2 to the block 1 so that the number of inter-block edges becomes 1 and the optimum value can be updated.

Although the number of nodes adjacent to the current node has been calculated in the adjacent-node-number calculating step S32, the same effect can be achieved if the number of adjacent nodes is calculated for each node on the graph immediately before or after the seed-node-set generating step.

If the concept of "path" is further introduced in the adjacent-node-number calculating step S32 and the select parameter is adjusted by calculating the number of nodes by using the path, the total number of combinations is reduced more effectively.

Figure 12A:
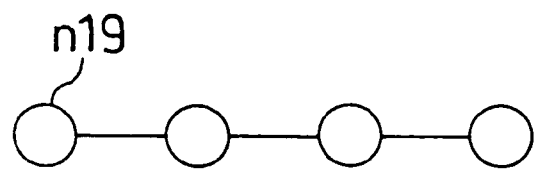
FIG. 12 are graphs illustrating "paths" according to the third embodiment of the present invention.
Figure 12B:
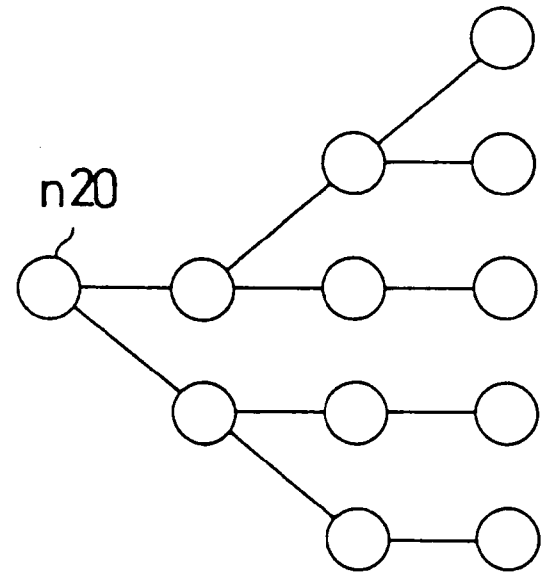

A specific description will be given with reference to FIGS. 12(a) and 12(b) illustrating paths, which are composed of nodes and edges alternately arranged and connected to each other. For example, four nodes lie on and included in the path including the first node n19 and having a given length of 3 or less shown in FIG. 12(a), while twelve nodes lie on the path including the second node n20 and having a given length of 3 or less shown in FIG. 12(b). If the select parameter is larger than 3, the number of node combinations is increased when a larger number of nodes lie on the path having a length of 3 or less. Consequently, the given length is valid as long as it is smaller than the select parameter. On the other hand, three nodes lie on the path including the first node n19 and having a length of 2 or less shown in FIG. 12(a), while seven nodes lie on the path including the second node n20 and having a length of 2 or less shown in FIG. 12(b), so that the number of nodes is reduced more effectively when the given length is 3 rather than 2.

Thus, according to the present embodiment, optimization cannot be achieved when the current node has a large number of adjacent nodes so that the select parameter indicating the number of nodes to be combined with each other and moved together between blocks is reduced to reduce the number of possible combinations, thereby suppressing an increase in processing time. When the current node has a small number of adjacent nodes, the select parameter is increased to increase the number of nodes that can be moved, thereby minimizing the number of inter-block edges and achieving optimization.

(Fourth Embodiment)

A fourth embodiment of the present invention will be described with reference to the drawings.

Figure 13:
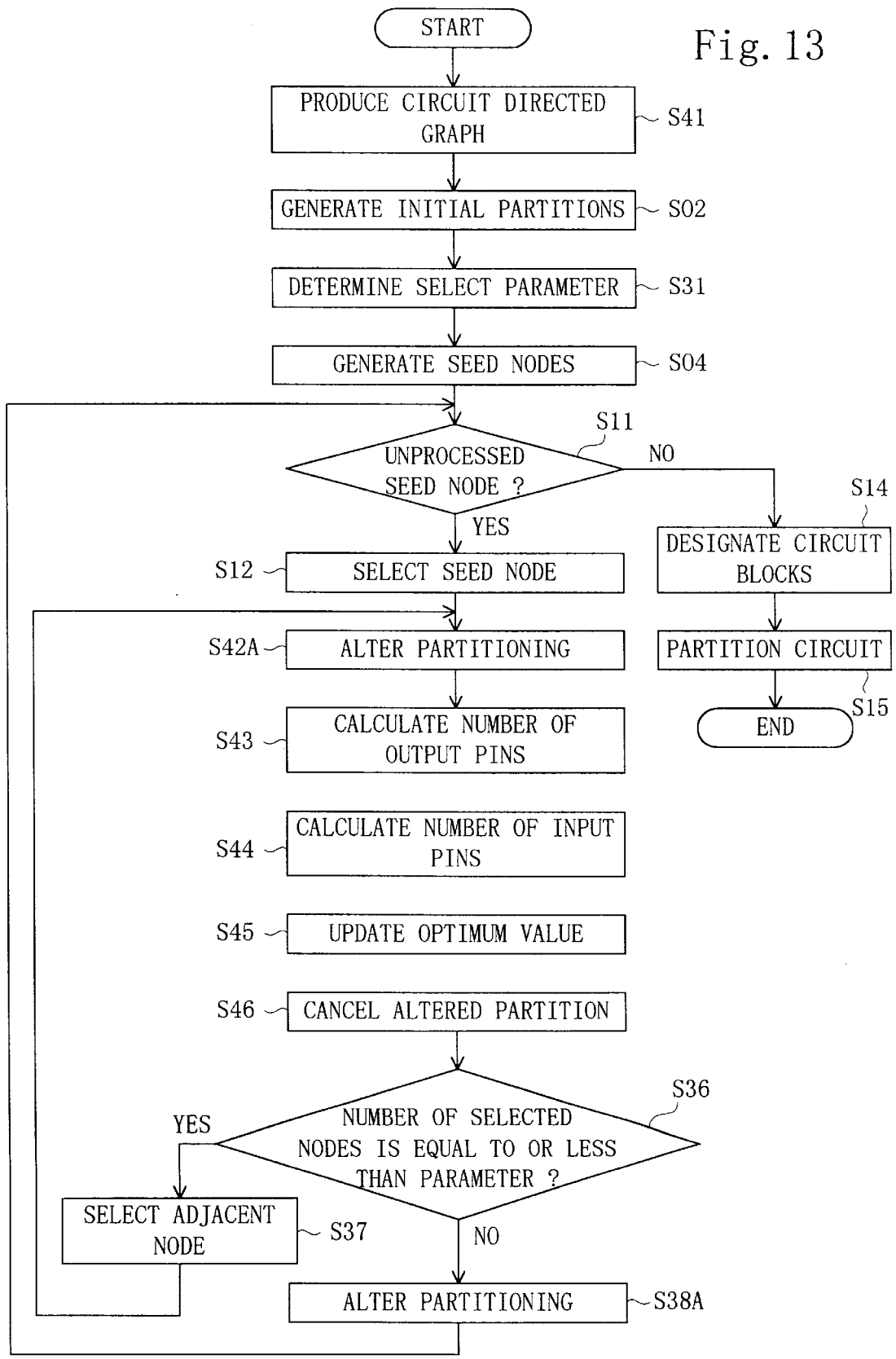
FIG. 13 shows a process flow in a method of partitioning a circuit according to a fourth embodiment of the present invention.

FIG. 13 shows a process flow in a method of partitioning a circuit according to a fourth embodiment of the present invention, in which the description of like steps described in the first and third embodiments will be omitted by providing like reference numerals.

First, in a circuit-directed-graph producing step S41, a circuit is represented as a directed graph having directed edges. The directed graph will be described later in greater detail.

Next, the initial-partitions generating step S02, the select-parameter determining step S31, the seed-node-set generating step S04, the unprocessed-seed-node judging step S11, and the seed-node selecting step S12 are followed by a first partition altering step S42A in which all nodes in the set of selected nodes are moved to the same block.

Next, in an output-pin-number calculating step S43 as the evaluation-function-value obtaining step, the number of nodes each having an edge starting therefrom and terminating at another node in a different block which does not contain the starting node is calculated and designated as the number of output pins.

Next, in an input-pin-number calculating step S44 as the evaluation-function-value obtaining step, each node having an edge starting therefrom and terminating at another node in a different block which does not contain the starting node is examined for the total number of different blocks containing terminal nodes at which edges extending from the starting node terminate and not containing the starting node. After examining all the starting nodes, the total numbers of different blocks obtained are added up to provide the number of input pins.

Next, in an optimum-value updating step S45, the sum of the number of output pins and the number of input pins is designated as the number of input/output pins. When the minimum value of the number of input/output pins has been initialized or the number of input/output pins is smaller than the previous minimum value, the number of input/output pins is designated as the minimum number and the set of selected nodes is designated as the set of minimum selected nodes, while the destination block to which the nodes are moved in the first partition altering step S42A is designated as an optimum block.

Next, in a partition-alteration cancelling step S46 as the partition altering step, all the nodes moved in the first partition altering step S42A are returned to the original block.

Next, in the select-node-number judging step S36, it is judged whether or not the number of nodes in the set of selected nodes exceeds the select parameter. If the select parameter is not exceeded, one node adjacent to the current node is selected and added, as a current node, to the set of selected nodes in the adjacent-node selecting step S37 and the whole process returns to the first partition altering step S42A. If the selection number is exceeded, the set of minimum selected nodes obtained in the optimum-value updating step S45 is moved to the optimum block in a second partition altering step S38 so that the minimum number of input/output pins is initialized and the whole process returns to the unprocessed-seed-node judging step S11.

Next, if there is no unprocessed seed node in the unprocessed-seed-node judging step S11, predetermined processing is performed in each of the circuit-block designating step S14 and the circuit partitioning step S15, thereby completing the partitioning of the circuit.

A detailed description will be given to the characteristics of the present embodiment by using specific data.

Figure 14:
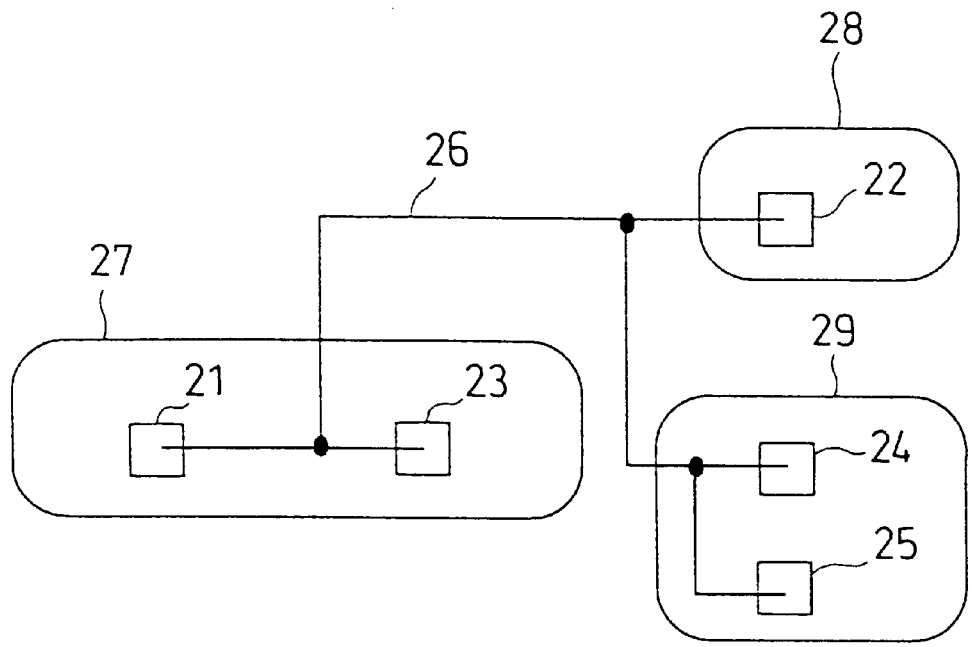
FIG. 14 shows a part of the circuit to be partitioned according to the fourth embodiment of the present invention.

FIG. 14 shows a part of the partitioned circuit. As shown in the drawing, a first block 27 contains first and third circuit elements 21 and 23 and a second block 28 contains a second circuit element 22, while a third block 29 contains fourth and fifth circuit elements 24 and 25. A net 26 is connected to the output terminal of the first circuit element 21, while it is connected to the input terminal of each of the second, third, fourth, and fifth circuit elements 22, 23, 24, and 25.

In the circuit, the number of nets between the blocks is 1, while the first block 27 has one output pin and each of the second and third blocks 28 and 29 has one input pin, so that each block has the total of three pins.

Figure 15:
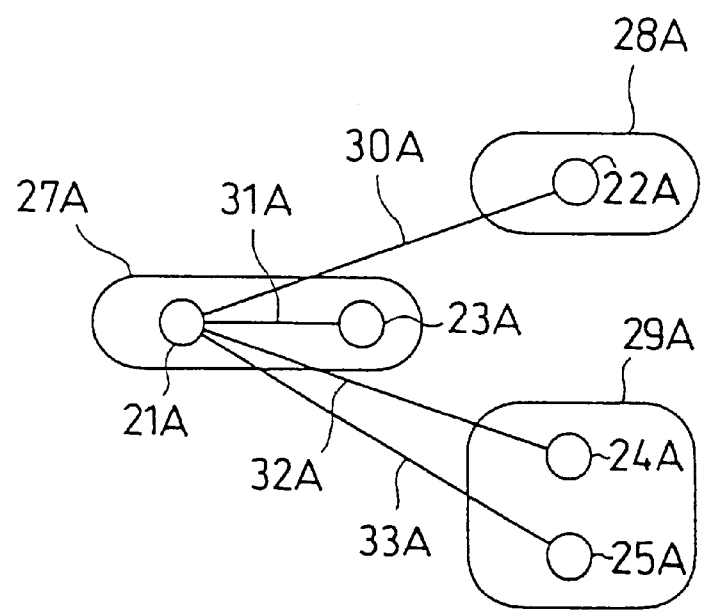
FIG. 15 is a graphical representation of the part of the circuit to be partitioned according to the fourth embodiment of the present invention.

FIG. 15 is a graphical representation of the circuit.

In FIG. 15 are shown: a first node 21A contained in a first block 27A and representing the first circuit element 21; and a third node 23A representing the third circuit element 23. The same shall apply to the second and third blocks 28A and 29A. There are also shown: a first edge 30A connecting the first node 21A to the second node 22A; a second edge 31A connecting the first node 21A to the third node 23A; a third edge 32A connecting the first node 21A to a fourth node 24A; and a fourth edge 33A connecting the first node 21A to a fifth node 25A.

However, since the graph does not show the number of nets and the numbers of pins of the blocks when the circuit has been partitioned, each edge on the graph has conventionally been weighted based on the number of output elements in producing the graph from the circuit. For example, since the number of output elements (nodes 22A to 25A) is 4 on the graph shown in FIG. 15, a quarter weight is assigned to each edge and the number of nets between the blocks is evaluated by adding up the weights for each inter-block edge.

On the graph shown in FIG. 15, the edges each having a quarter weight are present between the first and second blocks and between the first and third blocks, so that an evaluation function value for partitioning becomes three quarters, which does not precisely represent the number of nets between the blocks in the circuit, which is 1. Moreover, the number of pins of the blocks remains unknown.

Figure 16:
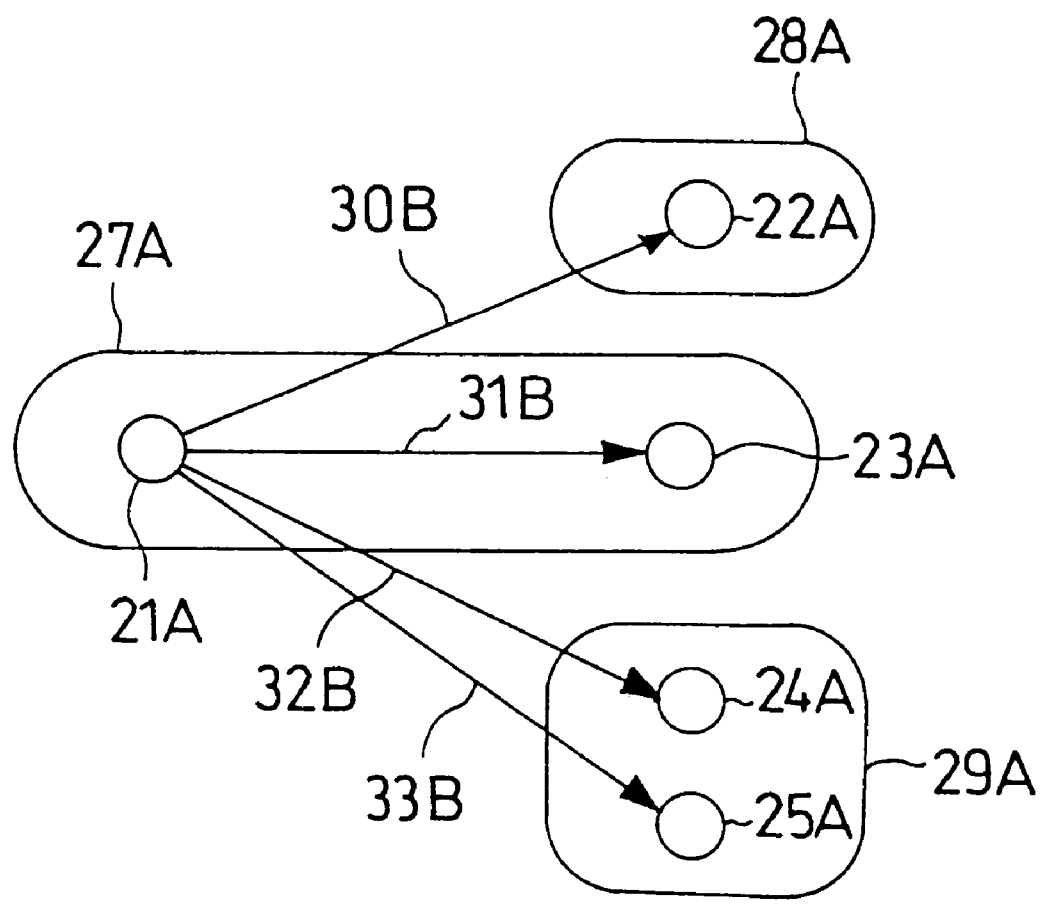
FIG. 16 is a directed-graphical representation of the part of the circuit to be partitioned according to the fourth embodiment of the present invention.

To eliminate the foregoing problems, the circuit shown in FIG. 14 is represented by using a directed graph to provide the graph of FIG. 16.

In FIG. 16 are shown edges 30B, 31B, 32B, and 33B of the directed graph, each of which starts from the first node 21A. The first edge 30B terminates at the second node 22A. The second edge 31B terminates at the third node 23A. The third edge terminates at the fourth node 24A. The fourth edge 33B terminates at the fifth node 25A.

With the use of the directed graph, the number of nets and the number of pins of the blocks when the circuit has been partitioned can be calculated.

(Method of Calculating Number of Nets)

The number of nets is calculated by counting the number of starting nodes from which edges start and terminate at other nodes in different blocks not containing the starting nodes. In this case, each of the starting nodes should be counted only once. On the directed graph shown in FIG. 16, the first, third, and fourth edges 30B, 32B, and 33B start from the first node 21A in one block and terminate at the respective nodes in the other blocks. The first node 21A is counted as the number of output pins in the output-pin-number calculating step S43 to provide the result close to 1, which is the number of inter-block nets shown in FIG. 14.

(Method of Calculating Number of Pins of Block)

To calculate the number of pins possessed by a block, each node having an edge starting therefrom and terminating at another node in a different block which does not contain the starting node is examined for the total number of different blocks containing terminal nodes at which edges extending from the starting node terminate and not containing the starting node. After examining all the starting nodes, the total numbers of different blocks obtained are added up to provide the number of input pins, which is added to the foregoing number of output pins. On the graph shown in FIG. 16, e.g., since the first edge 30B starting from the first node 21A in the first block 27A terminates at the node in the second block 28A, while the third and fourth edges 32B and 33B starting from the first node 21A in the first block 27A terminate at the nodes in the third block 29A, the number of input pins obtained in the input-pin-number calculating step S44 is 2. Accordingly, the number of input/output pins obtained by adding the number of output pins, which is 1, to the number of input pins, which is 2, in the subsequent optimum-value updating step S45 is 3, which is equal to the total number of pins possessed by each of the blocks.

Thus, since the present embodiment has represented the circuit by using the directed graph, the number of nets and the number of pins possessed by a block when the circuit has been partitioned can be calculated precisely, resulting in a higher degree of optimization.

Moreover, since a variation in the total number of pins possessed by the blocks in the whole circuit is calculated from the nodes and the edges connecting the nodes, while the select parameter indicating the maximum number of nodes to be combined with each other and moved together has been introduced, the total number of combinations is limited, resulting in shorter processing time.

In moving a node to a different block, a variation in evaluation function value has conventionally been calculated from the node to be moved and from the edge connected to the node to be moved so as to calculate the evaluation function value for partitioning at high speed. In the present embodiment using the directed graph, however, the node to be moved and the edge connected to the node to be moved are insufficient to calculate variations in the number of inter-block nets and in the number of pins possessed by the block after the node has been moved to another block. It is also necessary to consider nodes adjacent to the node to be moved.

Accordingly, the process flow shown in FIG. 13 is improved as follows.

(Variation of Fourth Embodiment)

A variation of the fourth embodiment of the present invention will be described with reference to the drawings.

Figure 17:
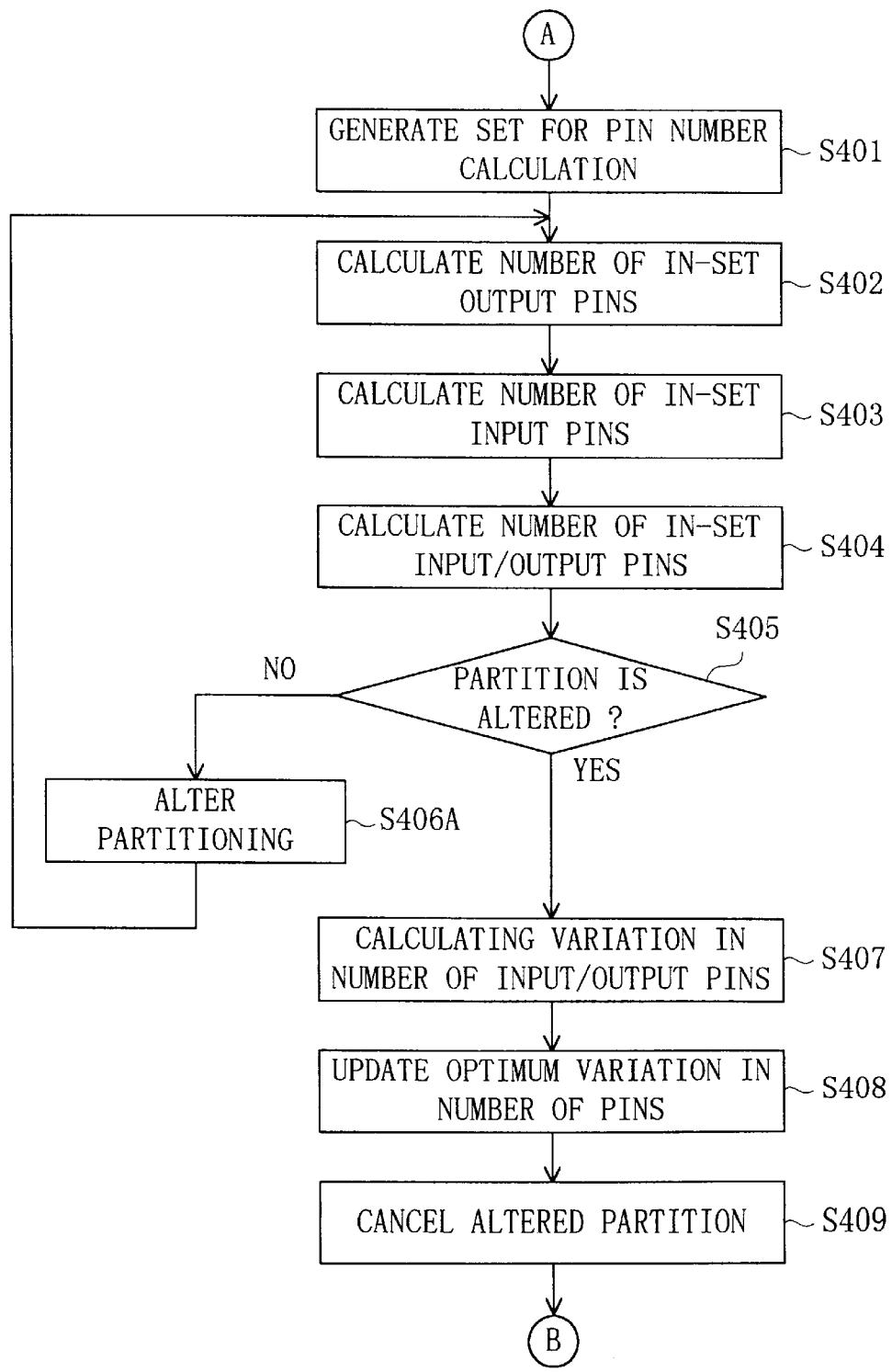
FIG. 17 shows a process subflow in the method of partitioning a circuit according to a variation of the fourth embodiment of the present invention.

FIG. 17 shows a subflow to be used in the process flow of FIG. 13 illustrating the fourth embodiment.

The sequence of process steps shown in FIG. 17 are a replacement for the first partition altering step S42A to the partition-alteration cancelling step S46 in the process flow shown in FIG. 13.

In a pin-number-calculation-set generating step S401 subsequent to the seed-node selecting step S12 shown in FIG. 13, a set of nodes for pin number calculation composed of all nodes in the set of selected nodes and all nodes adjacent to at least one node in the set of selected nodes is generated.

Next, in an in-set-output-pin-number calculating step S402 as an input/output-pin-number obtaining step, the number of starting nodes contained in the set of nodes for pin number calculation and having edges starting therefrom and terminating at nodes contained in the set of nodes for pin number calculation and also in different blocks which do not contain the starting nodes is calculated to provide the number of output pins in the set of nodes for pin number calculation.

Next, in an in-set-input-pin-number calculating step S403 as the input/output-pin-number obtaining step, each starting node is examined for the total number of blocks contained in the set of nodes for pin number calculation, containing terminal nodes at which edges extending from the starting node terminate, and not containing the starting node.

Next, in an in-set-input/output-pin-number calculating step S404, the sum of the number of output pins and the number of input pins in the set of nodes for pin number calculation is designated as the number of input/output pins in the set of nodes for pin number calculation.

Next, in a partition-alteration judging step S405, it is judged whether or not the partition altering process for moving and assigning all nodes in the set of selected nodes to the same block has been performed. If the partition altering process has not been performed, the whole process advances to a first partition altering step S406A where all nodes in the set of selected nodes are moved to the same block. After that, the whole process returns to the in-set-output-pin-number calculating step S402.

If the partition altering process has been performed, the number of input/output pins in the set of nodes for pin number calculation prior to the first partition altering step S406 is subtracted from the number of input/output pins in the set of nodes for pin number calculation after the first partition altering step S406 in an input/output-pin-number-variation calculating step S407 as the evaluation-function-value obtaining step so that a variation in the number of input/output pins is obtained.

Next, when the minimum value of the variation in the number of input/output pins has been initialized or when the variation in the number of input/output pins is smaller than the previous minimum value, the variation in the number of input/output pins is designated as the minimum value and the set of selected nodes is designated as the set of minimum selection nodes, while the destination block to which the nodes have been moved in the first partition altering step S406 is designated as the optimum block in a pin-number-optimum-variation updating step S408 as the optimum-value altering step.

Next, in a partition-alteration cancelling step S409, all the nodes moved in the first partition altering step S406 are returned to the original block.

A detailed description will be given to the present variation by using specific data.

Figure 18:
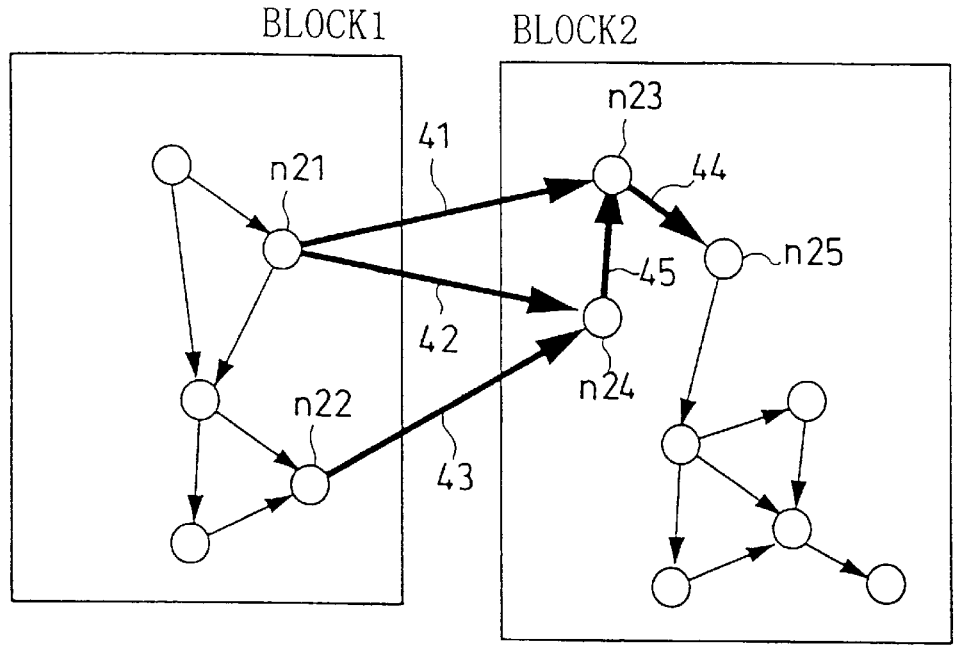
FIG. 18 is a directed-graphical representation of a part of the circuit to be partitioned according to the variation of the fourth embodiment of the present invention.

FIG. 18 is a directed-graphical representation of a part of the circuit to be partitioned.

First, in the seed-node selecting step S12 shown in FIG. 13, the third and fourth nodes n23 and n24 contained in the second block are selected as seed nodes to generate the set of selected nodes as current nodes. Then, in the pin-number-calculation-set generating step S401, the set of nodes for pin number calculation containing the third and fourth nodes n23 and n24 and the first, second, and fifth nodes n21, n22, and n25 adjacent thereto is generated.

Next, in the in-set-output-pin-number calculating step S402, the number of output pins in the set of nodes for pin number calculation is 2, since the first and second nodes n21 and n22 contained in the set of nodes for pin number calculation serve as starting nodes for edges terminating at nodes contained in the set of nodes for pin number calculation and also in blocks which do not contain the starting nodes.

Next, in the in-set-input-pin-number calculating step S403, the third and fourth nodes n23 and n24 serving as terminal nodes for the first and second edges 41 and 42 starting from the first node n21 in the set of nodes for pin number calculation are contained in the set of nodes for pin number calculation and also in the block 2. The fourth node n24 serving as the terminal node for the third edge 43 starting from the second node n22 in the set for calculating the number of pins is contained in the set of nodes for pin number calculation and also in the block 2. To calculate the number of blocks for each starting node, therefore, the first and second nodes n21 and n22 are counted as the number of input pins in the set of nodes for pin number calculation.

Next, in the in-set-input/output-pin-number calculating step S404, the number of output pins and the number of input pins, each of which is 2, in the set of nodes for pin number calculation are added up to provide the number of input/output pins in the set of nodes for pin number calculation, which is 4.

Figure 19:
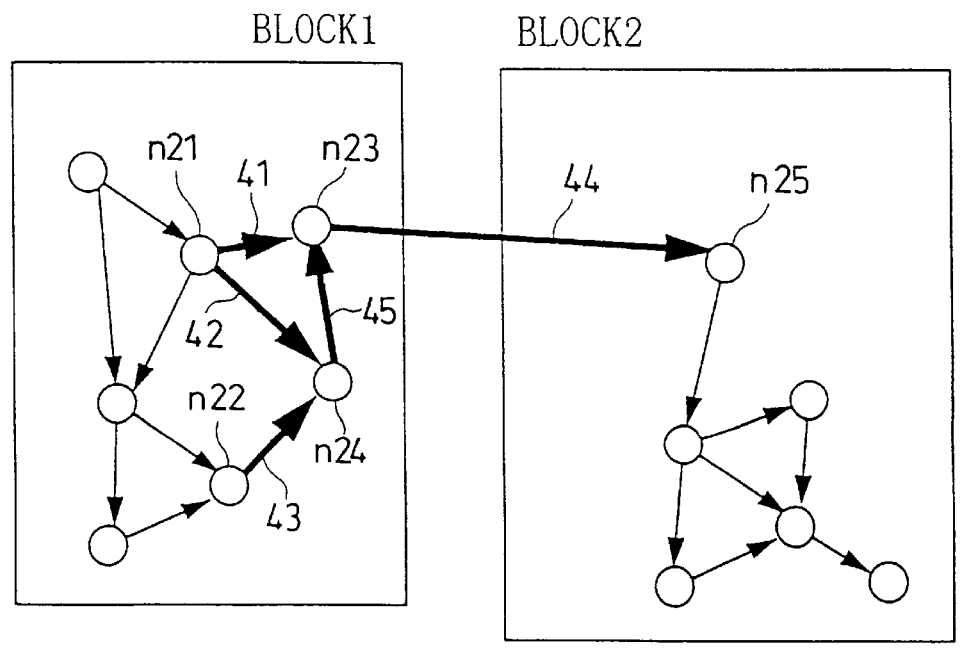
FIG. 19 is a directed-graphical representation of the circuit excellently partitioned by the circuit partitioning method according to the variation of the fourth embodiment of the present invention.

Next, as shown in FIG. 19, partitioning is altered whereby the third and fourth nodes n23 and n24 as current nodes are moved from the second block 2 to the adjacent block 1 in the first partition altering step S406A.

Next, in the in-set-output-pin-number calculating step S402, the number of output pins in the set of nodes for pin number calculation is 1, since the third node n23 shown in FIG. 19 is contained in the set of nodes for pin number calculation and serves as a starting node for an edge terminating at a node contained in the set of nodes for pin number calculation and also in a different block which does not contain the starting node.

Next, in the in-set-input-pin-number calculating step S403, the fifth node n25 serving as the terminal node for the fourth edge 44 starting from the third node n23 contained in the set of nodes for pin number calculation is contained in the set of nodes for pin number calculation and also in the block 2. Therefore, only the block 2 is obtained for the third node n23 so that the number of input pins in the set of nodes for pin number calculation is 1.

Next, in the in-set-input/output-pin-number calculating step S404, the number of output pins and the number of input pins, each of which is 1, in the set of nodes for pin number calculation, are added up to provide the number of input/output pins in the set of nodes for pin number calculation, which is 2.

Next, in the input-output-pin-number-variation calculating step S407, the number of input/output pins in the set of nodes for pin number calculation prior to the partition altering process, which is 4, is subtracted from the number of input/output pins in the set of nodes for pin number calculation after the partition altering process, which is 2, to provide the variation in the number of input/output pins, which is −2.

Thus, since the present embodiment has considered not only the nodes in the set of nodes for pin number calculation and the edges connected to the nodes but also the adjacent nodes, a higher degree of optimization is achieved by calculating a variation in the total number of pins possessed by the block. Moreover, the total number of combinations is limited by the introduction of the select parameter indicating the maximum number of nodes combined with each other and moved together, so that processing speed is increased.

(Fifth Embodiment)

A fifth embodiment of the present invention will be described with reference to the drawings.

Figure 20:
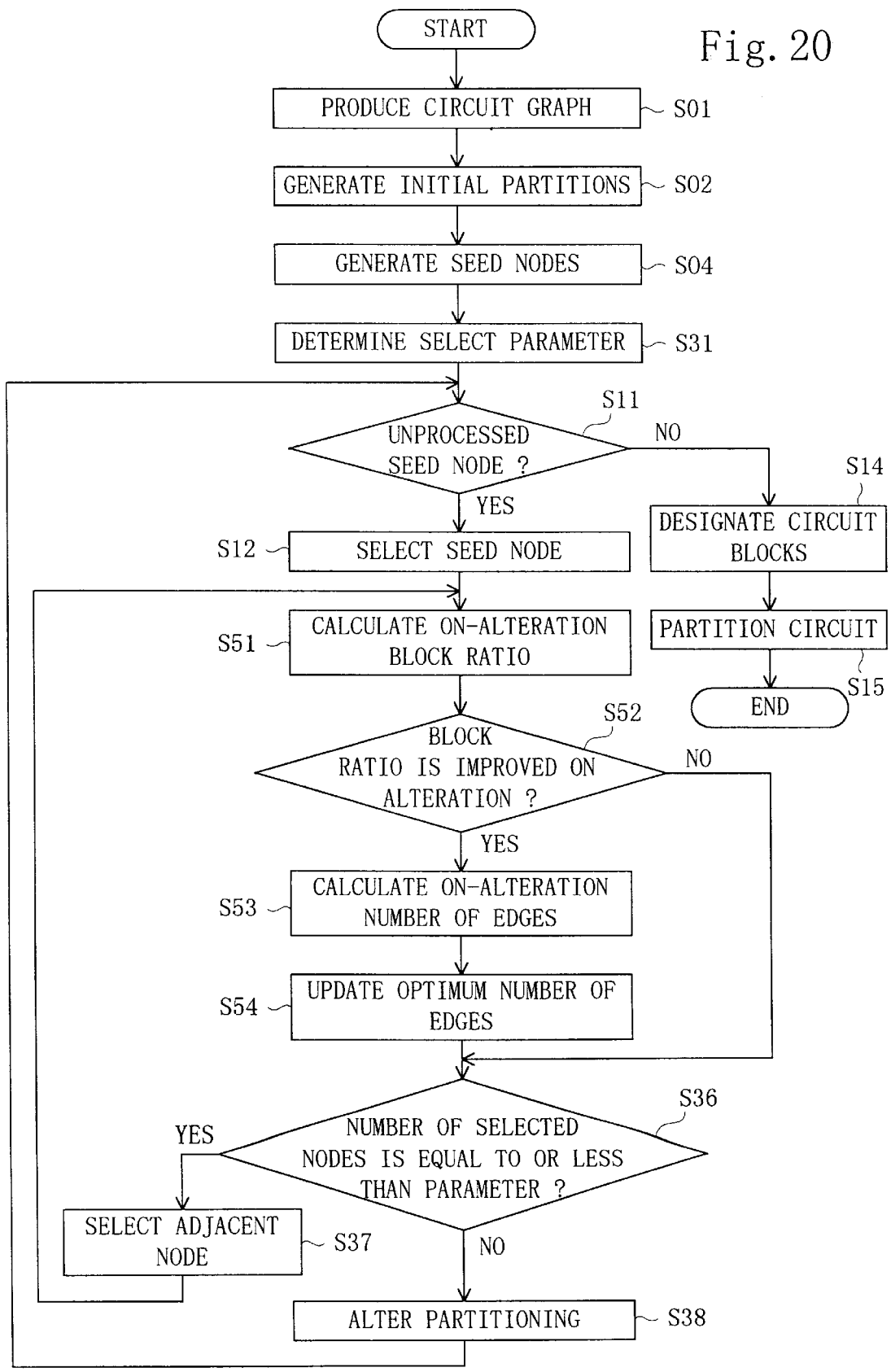
FIG. 20 shows a process flow in accordance with a method of partitioning a circuit according to a fifth embodiment of the present invention.

FIG. 20 shows a process flow in a method of partitioning a circuit according to a fifth embodiment of the present invention, in which the description of like steps described in the first and third embodiments will be omitted by providing like reference numerals.

The present embodiment is only different from the third embodiment illustrated in FIG. 7 in that, when partitioning is altered by moving the select block, the dimension of the original block is compared with that of the destination block to maintain the same ratio before and after alteration.

First, in the seed-node selecting step S12, a node satisfying the requirements on a seed node is selected and designated as a current node to generate a set of seed nodes.

Next, in an on-alteration block-ratio calculating step S51, all nodes in the set of selected nodes are temporarily moved to the same block and the ratio of the number of nodes contained in the original block to the number of nodes contained in the destination block is calculated. Then, in a block-ratio-improvement judging step S52, it is judged whether or not the ratio after alteration is closer to 1 than the ratio before alteration.

If the ratio after alteration has been improved, the number of inter-block edges is calculated in an on-alteration edge-number calculating step S53 as the evaluation-function-value obtaining step, on the assumption that all nodes in the set of selected node have temporarily been moved.

Next, in an optimum-edge-number updating step S54 as the optimum-value updating step, when the minimum value of the number of inter-block edges has been initialized or the number of inter-block edges is smaller than the previous minimum value, the number of inter-block edges is designated as the minimum value and the set of selected nodes is designated as the set of minimum selected nodes, while the block is designated as the optimum block.

A detailed description will be given to the present embodiment by using specific data.

Figure 21:
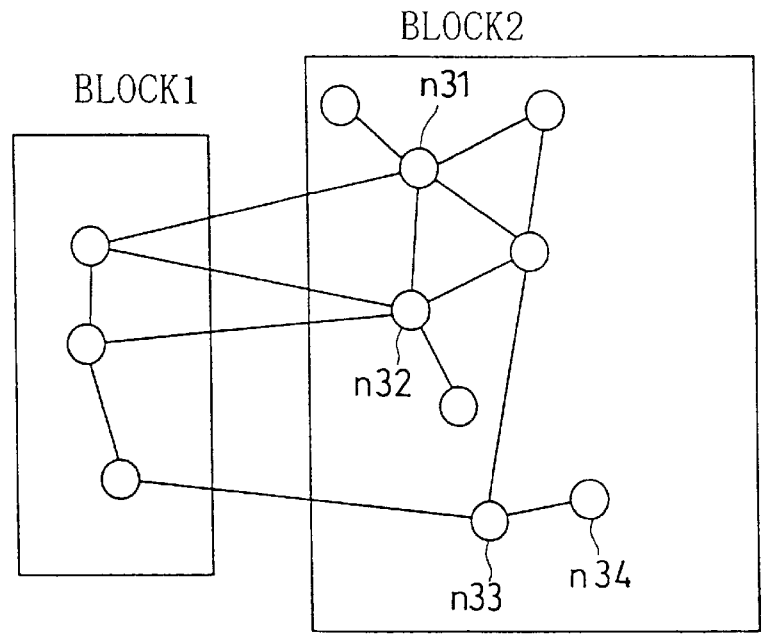
FIG. 21 is a graphical representation of a part of the circuit to be partitioned according to the fifth embodiment of the present invention.

FIG. 21 is a graphical representation of a part of the circuit to be partitioned. The graph shown in FIG. 21 contains three nodes in the block 1 and eight nodes in the block 2. To improve the numbers of nodes contained in the blocks 1 and 2, it is necessary to move some of the nodes contained in the block 2 to the block 1.

Figure 22:
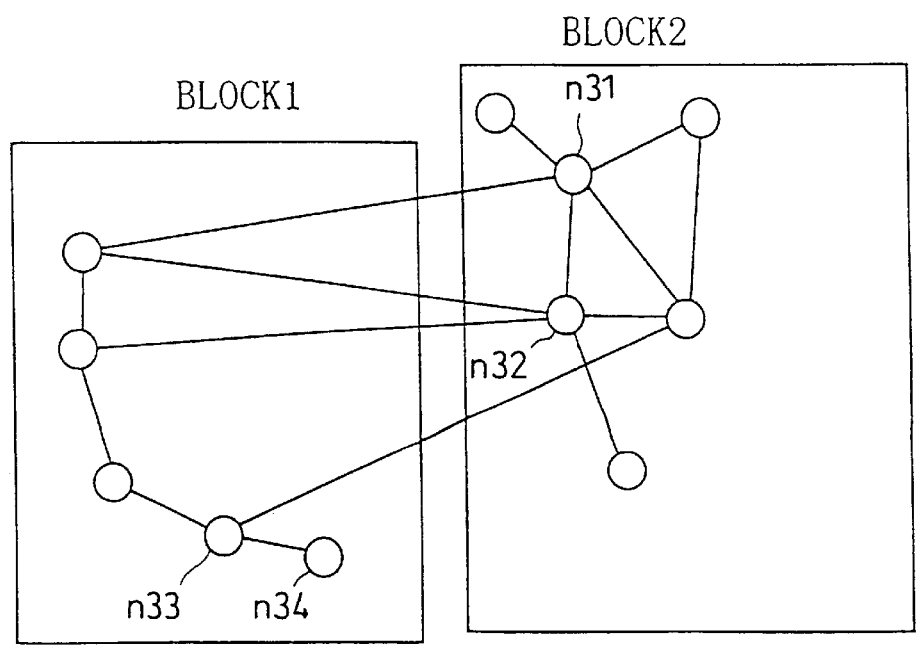
FIG. 22 is a graphical representation of the circuit excellently partitioned by the circuit partitioning method according to the fifth embodiment of the present invention.

If the third and fourth nodes n33 and n34 are temporarily moved simultaneously to the block 1 in the on-alteration block-ratio calculating step S51, the ratio between the numbers of nodes contained in the blocks is improved from 3:8 before alteration shown in FIG. 21 to 5:6 after alteration shown in FIG. 22. From the examination of the number of inter-block edges in the on-alteration edge-number calculating step S53, it will be understood that the number of inter-block edges has not been increased.

However, if another node, e.g., the first node n31 is temporarily moved to the block 1, the number of inter-block edges is increased from 4 to 7, so that the third and fourth nodes n33 and n34 are determined to be the set of minimum selected nodes in the optimum-edge-number updating step S54, as shown in FIG. 22. Hence, the optimum block is the block 1 to which the third and fourth nodes n33 and n34 have been moved simultaneously.

Thus, since the present embodiment has examined the ratio between the numbers of nodes contained in the blocks ratio on alteration and examines the number of inter-block edges after alteration only when the examined ratio is closer to 1, the circuit can be partitioned into equal-sized blocks even when the partitioning of the circuit is altered and the number of inter-block edges can be reduced.

(Sixth Embodiment)

A sixth embodiment of the present invention will be described with reference to the drawings.

Figure 23:
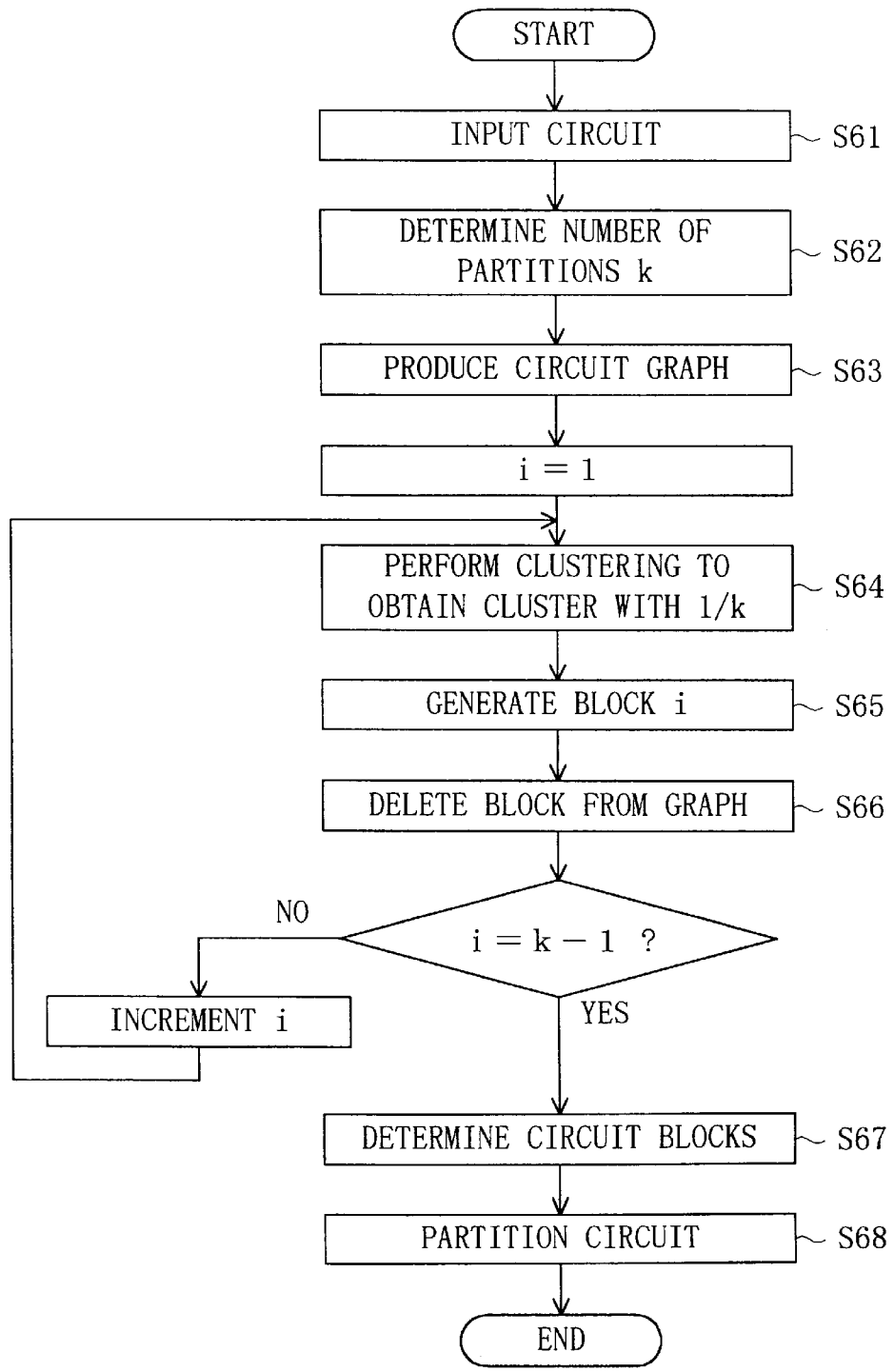
FIG. 23 shows a process flow in a method of partitioning a circuit according to a sixth embodiment of the present invention.

FIG. 23 shows a process flow in a method of partitioning a circuit according to the sixth embodiment of the present invention.

As shown in FIG. 23, a circuit to be partitioned is inputted in a circuit input step S61 and then a desired number of partitions k, which is a natural number, is determined in a partition-number determining step S62, followed by the production of a graph representing the circuit in a circuit-graph producing step S63.

Next, in a cluster generating step S64, nodes on the graph are clustered and a cluster closest in dimension to 1/k of the circuit is searched for. Then, the cluster found in the cluster generating step S64 is designated as a block in the subsequent block generating step S65.

Next, in a graph updating step S66, all nodes clustered and assigned to the block and all edges connected to the nodes are deleted from the graph and the cluster generating step S64 to the block generating step S65 are repeatedly performed till (k−1) blocks are generated.

Next, in a circuit-block designating step S67 as a blocking step, the final node is assigned to the k-th block. Then, in the graph updating step S66, individual circuit blocks are designated as such by using the generated blocks. Finally, the circuit is partitioned based on the circuit blocks corresponding to the individual nodes in a circuit partitioning step S68.

A detailed description will be given to the present embodiment by using specific data.

Figure 24:
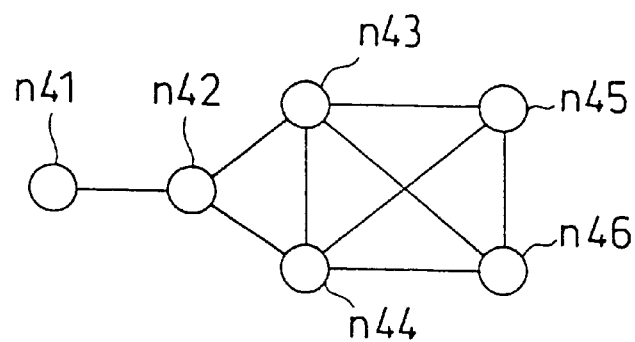
Figure 24:
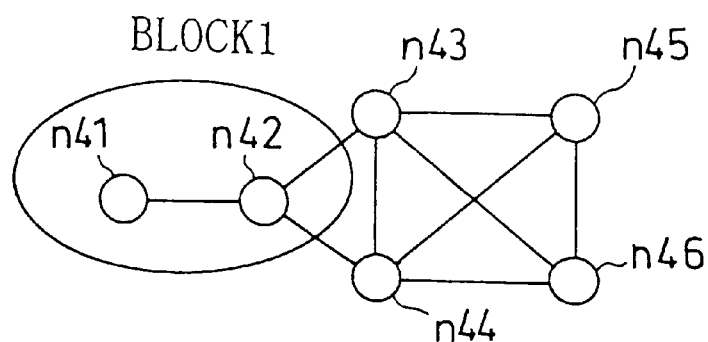
Figure 24:
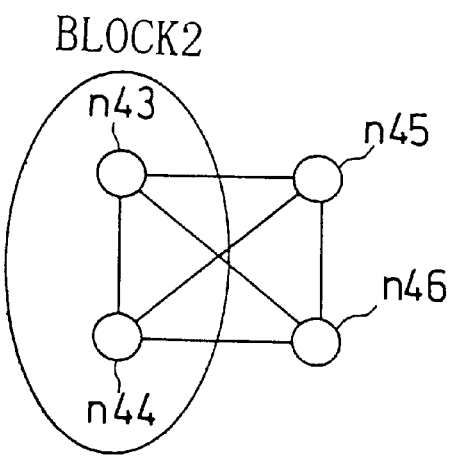
Figure 24:
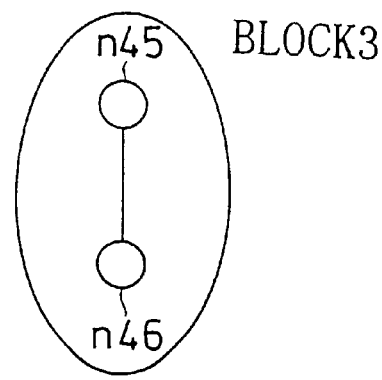

FIGS. 24 illustrate a sequence of process steps in the circuit partitioning method according to the present embodiment, of which FIG. 24(a) is a graphical representation of a part of the circuit to be partitioned. As shown in FIG. 24(a), the graph is composed of the six nodes n41 to n46.

A consideration will be given to the case where the graph composed of the six nodes shown in FIG. 24(a) is partitioned into three blocks.

First, in the cluster generating step S64, the nodes n41 and n42 are clustered as shown in FIG. 24(b) so that the resulting cluster is designated as the block 1 in the block generating step S65.

Next, in the graph updating step S66, the graph is updated by deleting the first and second nodes n41 and n42 assigned to the block 1 and all edges connected to the first and second nodes n41 and n42. Then, the third and fourth nodes n43 and 44 are clustered in the cluster generating step S64 as shown in FIG. 24(c) so that the cluster is designated as the block 2 in the block generating step S65.

Next, in the graph updating step S66, the graph is updated by deleting the third and fourth nodes n43 and n44 assigned to the block 2 and all edges connected to the third and fourth nodes n43 and n44. Thereafter, as shown in FIG. 24(d), the remaining fifth and sixth nodes n45 and n46 are assigned to the block 3 in the circuit-block designating step S67 and individual circuit blocks are designated as such by using the individual blocks 1 to 3 generated in the graph updating step S66.

Next, in the circuit partitioning step S68, the circuit is partitioned in accordance with the foregoing circuit blocks corresponding to the individual nodes.

Since the cluster generating step S64, the block generating step S65, and the graph updating step S66 have thus been performed repeatedly, the circuit can be partitioned into blocks of equal dimensions.

(Seventh Embodiment)

A seventh embodiment of the present invention will be described with reference to the drawings.

Figure 25:
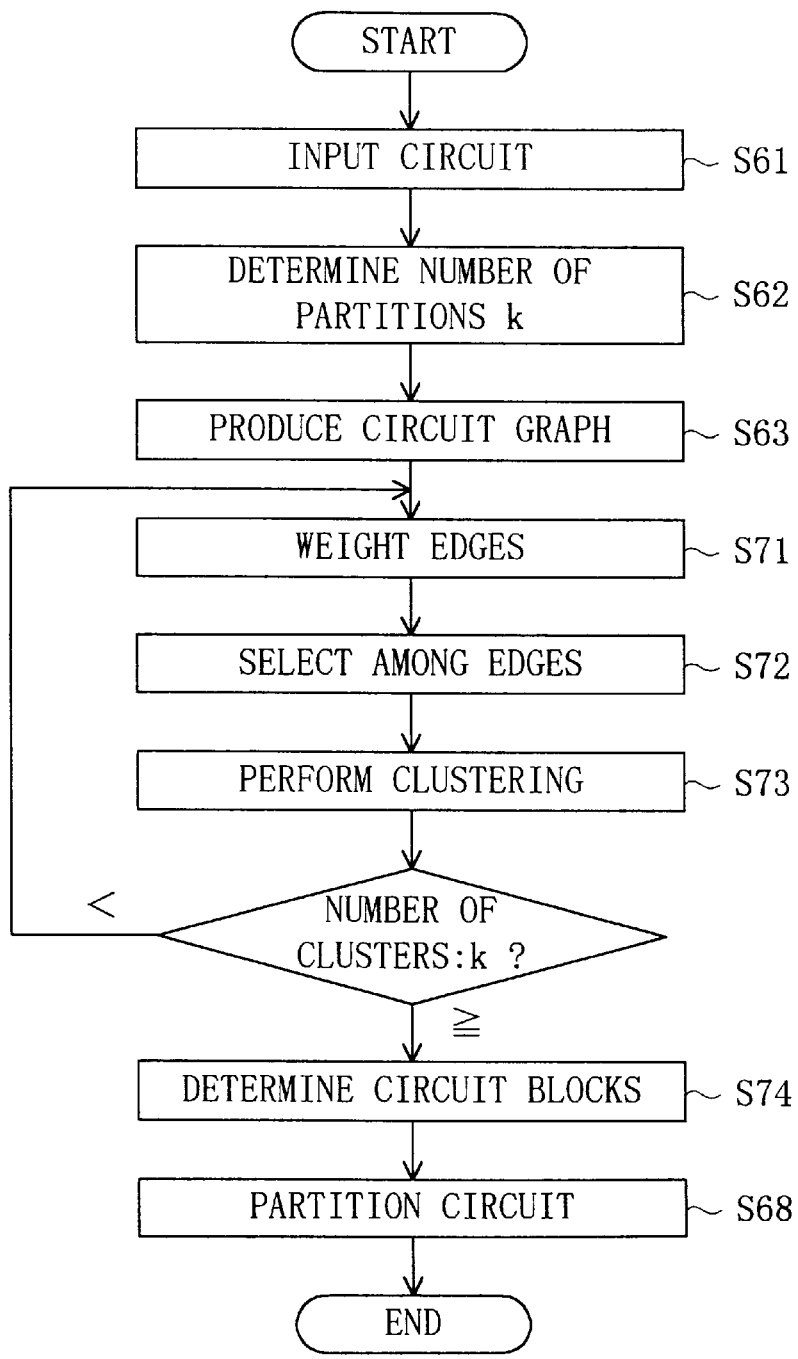
FIG. 25 shows a process flow in a method of partitioning a circuit according to a seventh embodiment of the present invention.

FIG. 25 shows a process flow in a method of partitioning a circuit according to the seventh embodiment of the present invention.

As shown in FIG. 25, a circuit to be partitioned is inputted in the circuit input step S61 and then a desired number of partitions k, which is a natural number, is determined in the partition-number determining step S62, followed by the production of a graph representing the circuit in the circuit-graph producing step S63. Next, in an edge weighting step S71 as an inter-edge-node-number obtaining step, the respective dimensions of clusters containing nodes connected to each edge (the numbers of nodes contained in the clusters) are added up for each edge and the result of calculation is stored as a weight assigned to the edge.

Next, in an edge selecting step S72 as the cluster generating step, selection is made among the combinations of clusters containing nodes connected to an edge with the minimum weight such that the number of inter-cluster edges is minimized after clustering. Then, in a clustering step S73 as the cluster generating step, clustering is performed with respect to the graph in accordance with the combination selected in the preceding step. The edge weighting step S71 to the clustering step S73 are repeatedly performed till the number of clusters becomes k.

Next, in a circuit-block designating step S74 as the blocking step, individual circuit blocks are designated as such by using the clusters generated in the clustering step S73. Finally, in the circuit partitioning step S68, the circuit is partitioned in accordance with the circuit blocks corresponding to the individual nodes.

A detailed description will be given to the present embodiment by using specific data.

Figure 26A:
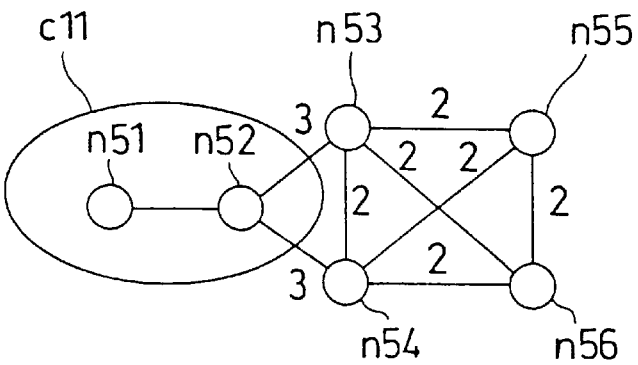

FIGS. 26 illustrate a sequence of process steps in the circuit partitioning method according to the present embodiment, of which FIG. 26(a) is a graphical representation of a part of the circuit to be partitioned. As shown in FIG. 26(a), the graph is composed of the first to sixth nodes n51 to n56.

As shown in FIGS. 26, each edge extending between nodes is weighted in accordance with the dimensions of the nodes. In the case where an edge is connected to a node contained in a cluster, it is weighted in accordance with the dimension of the cluster. The numeric characters accompanying the edges indicate the respective weights assigned thereto.

A consideration will be given to the case where the graph shown in FIG. 26(a) is partitioned into three blocks.

First, in a clustering step S73, the first and second nodes n51 and n52 are clustered, as shown in FIG. 26(a). Since the second node n52 belongs to the first cluster c11 having the dimension of 2, the addition of 1 as the weight assigned to the third node n53 provides 3 as the weight assigned to the edge connecting, e.g., the second node n52 to the third node n53 in the subsequent edge weighting step S71.

Figure 26B:
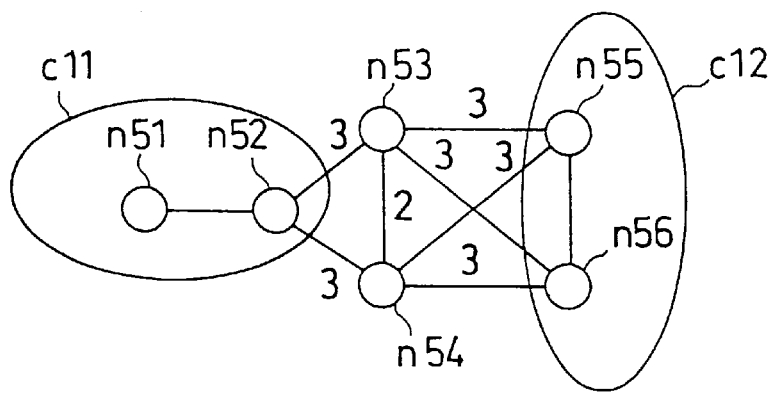

In the subsequent edge selecting step S72, the edge connecting the fifth node n55 to the sixth node n56 is selected to select among the combinations of clusters which contain nodes connected to the edge with the minimum weight such that the number of inter-cluster edges is minimized after clustering. In the subsequent clustering step S73, clustering is therefore performed with respect to the fifth and sixth nodes n55 and n56 to generate a second cluster n12, as shown in FIG. 26(b).

Figure 26C:
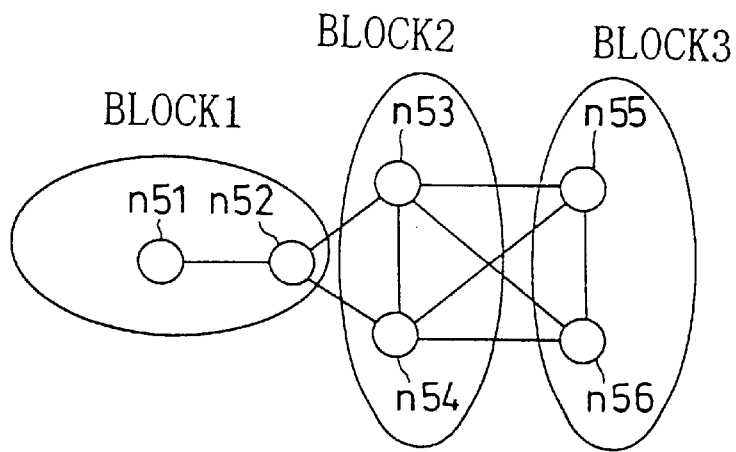

Consequently, the graph is eventually partitioned into three blocks each having two nodes, as shown in FIG. 26(c).

Thus, the present embodiment has performed clustering such that the resulting cluster contains a node connected to the edge with a minimum weight. Accordingly, a cluster larger in weight than a node is inevitably removed in the subsequent clustering so that an existing cluster is never clustered again. Moreover, since selection is made among the clusters such that the number of inter-cluster edges is minimized, blocks generated by partitioning are equal in dimension and the number of connections between the individual blocks is optimized.

(Eighth Embodiment)

An eighth embodiment of the present invention will be described with reference to the drawings.

Figure 27:
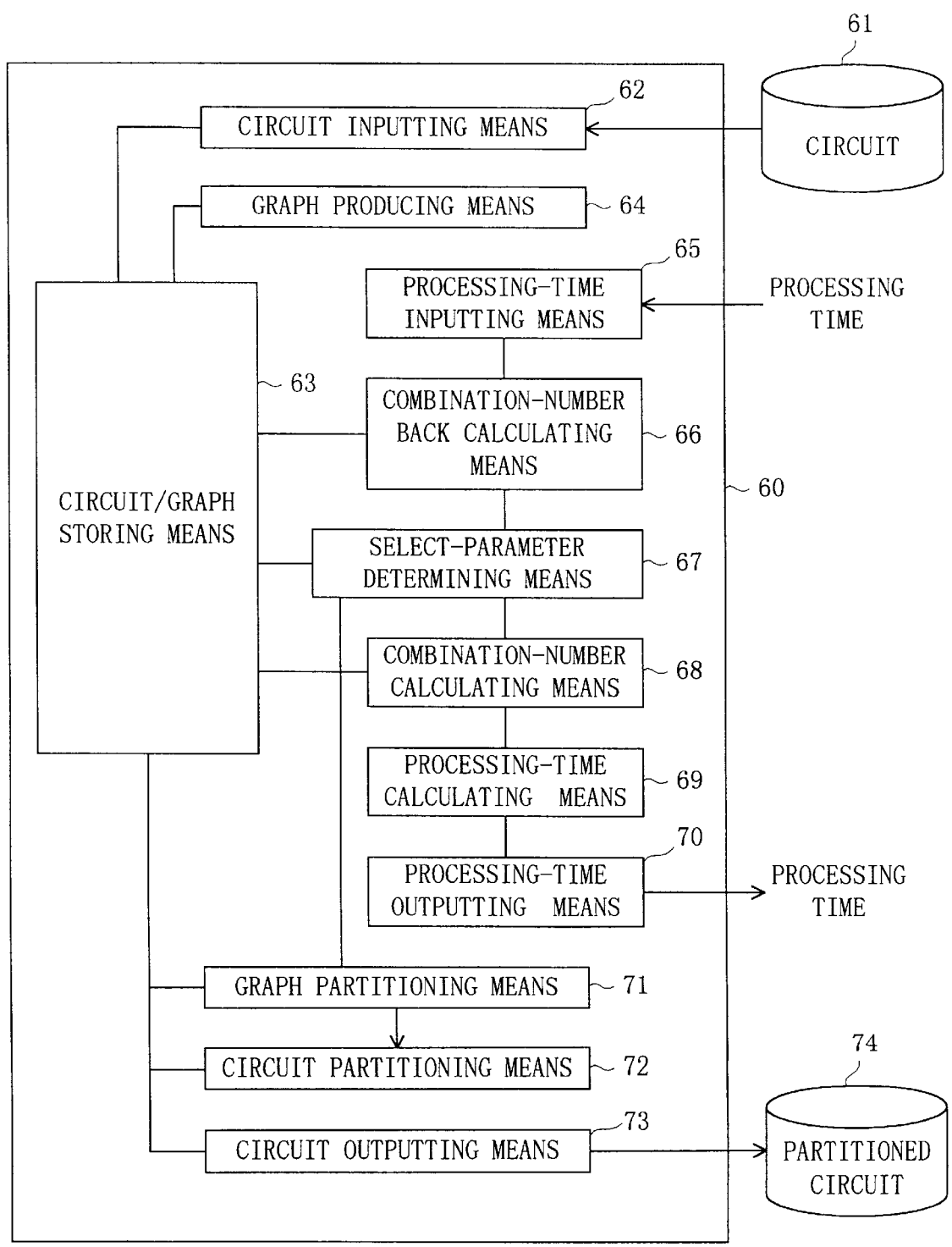
FIG. 27 is a functional block diagram showing an apparatus for partitioning a circuit according to an eighth embodiment of the present invention.
Figure 28:
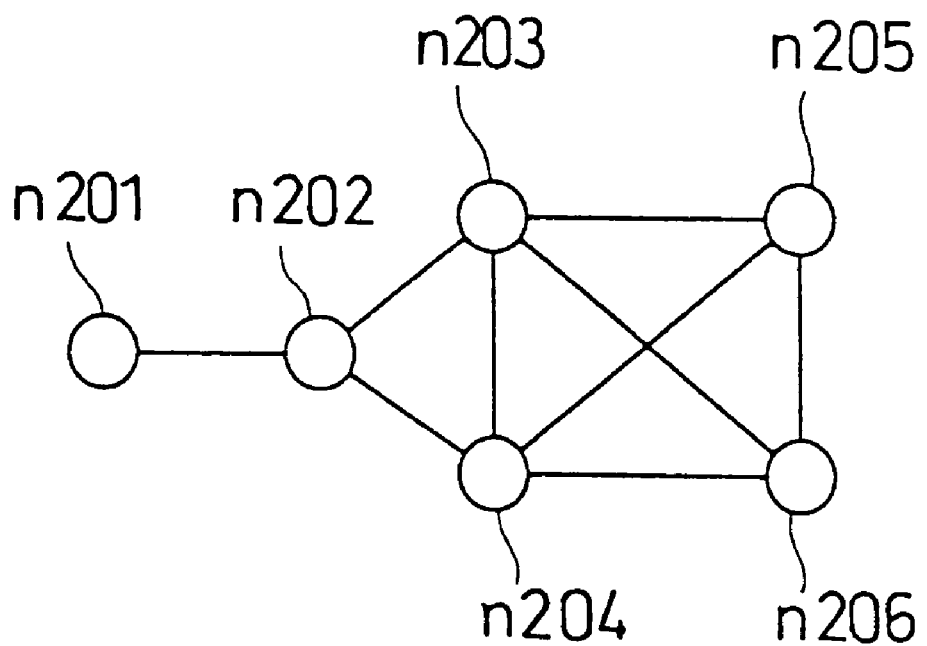
FIG. 28 is a graphical representation of a part of a circuit to be partitioned in a conventional method of partitioning a circuit.
Figure 29A:
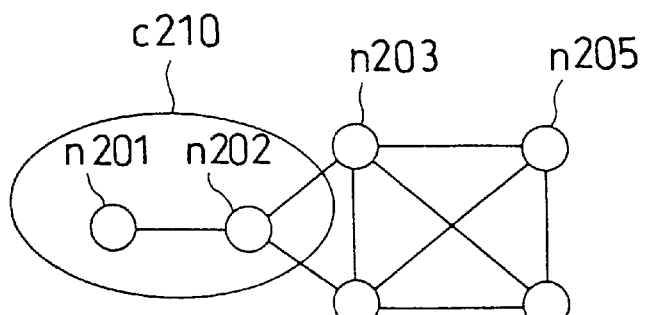
Figure 29B:
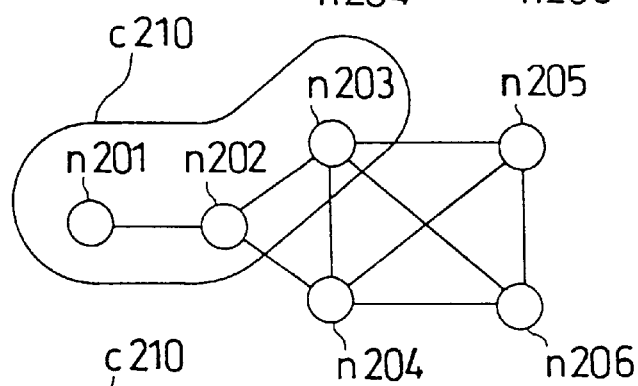
Figure 29C:
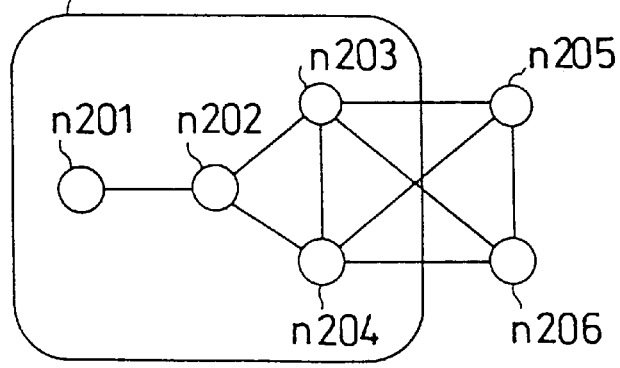
Figure 29D:
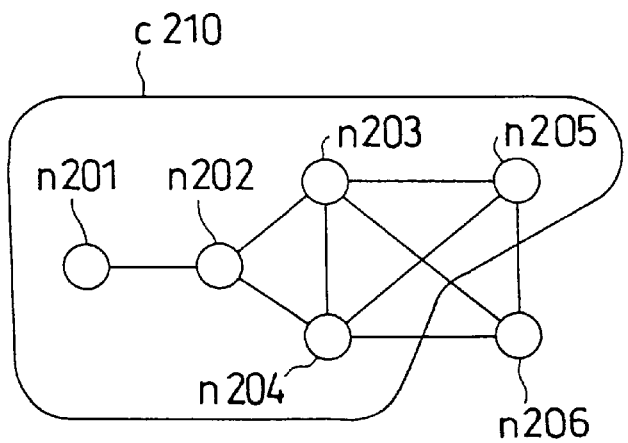
Figure 30A:
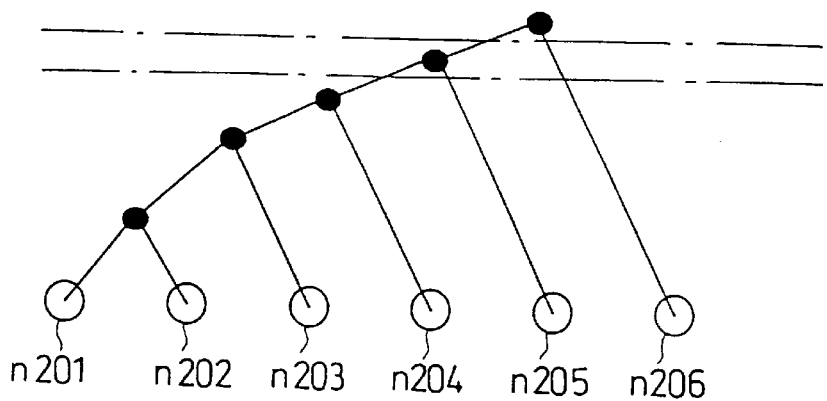
Figure 30B:
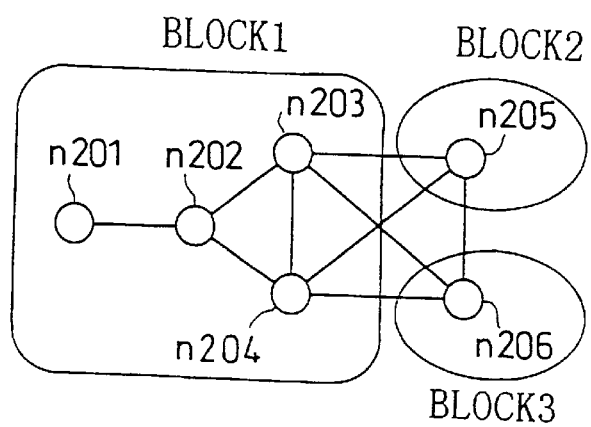

FIG. 27 is a functional block diagram showing an apparatus for partitioning a circuit according to the eighth embodiment of the present invention. In the drawing are shown: the circuit partitioning apparatus 60 according to the present embodiment; a first external memory 61 having thereon circuit data on an LSI circuit or the like to be partitioned; circuit inputting means 62 for fetching the circuit data from the first external memory 61 and supplying the fetched circuit data to circuit/graph storing means 63; the circuit/graph storing means 63 for holding a circuit or a graphical representation of the circuit and composed of an internal storage for providing an operational region for each means; graph producing means 64 for representing the circuit by causing cells as circuit elements to correspond to nodes in the circuit data developed in a specified region of the circuit/graph storing means 63; processing-time inputting means 65 for preliminarily receiving processing time required for partitioning from the outside; combination-number back calculating means 66 for calculating, when improved partitioning of the graph is intended by moving properly combined nodes to the same block, the total number of node combinations that can be moved completely within the processing time inputted via the processing-time inputting means 65; select-parameter determining means 67 for calculating and determining a select parameter indicating the number of nodes to be combined with each other based on the total number of node combinations to be moved when specific processing time for partitioning is supplied from the outside via the processing-time inputting means 65, while determining an appropriate select parameter when no specific processing time for partitioning is supplied from the outside; combination-number calculating means 68 as combination-number back calculating means for grouping nodes in numbers equal to or smaller than the value of the select parameter and calculating the number of possible node combinations that can be moved when no specific processing time for partitioning is supplied from the outside; processing-time calculating means 69 for calculating time required to optimize partitioning based on the number of possible node combinations that can be moved when no specific processing time for partitioning is supplied from the outside; processing-time outputting means 70 for outputting, when specific processing time for partitioning is supplied from the outside via the processing-time inputting means 65, the processing time to the outside, while outputting, when no specific processing time for partitioning is supplied from the outside, processing time calculated by the processing-time calculating means 69 to the outside; graph partitioning means 71 for performing initial partitioning of the graph and optimizing the partitioning of the graph so that the number of inter-block edges is optimized by moving the nodes grouped in numbers equal to or smaller than the value of the select parameter to the same initial block; circuit partitioning means 72 for partitioning the circuit so that the partitioned circuit corresponds to the partitioned graph; circuit outputting means 73 for outputting data on the partitioned circuit to a second external memory; and the second external memory 74 such as a data base for holding the data on the partitioned circuit.

A description will be given to the operation of the circuit partitioning apparatus thus constituted.

First, circuit data is inputted from the first external memory 61 by the circuit inputting means 62, stored in a specified table of the circuit/graph storing means 63, represented as a graph by the graph producing means 64, and stored in a specified table of the circuit/graph storing means 63. Thereafter, the graph is partitioned into an appropriate number of blocks by the graph partitioning means 71 to generate initial blocks in an initializing process.

Next, if specific processing time is not supplied from the outside, an appropriate select parameter is determined by the select-parameter determining step 67 so that the combination-number calculating means 68 calculates the number of node combinations that can be moved by grouping the nodes in numbers equal to or smaller than the value of the select parameter. Then, the processing-time calculating means 69 calculates processing time for partitioning based on the product of the number of combinations and the time required to evaluate partitioning performed by moving the nodes in one combination to the first initial block, which is displayed by the processing-time outputting means 70.

If specific processing time is supplied from the outside, on the other hand, the specific processing time supplied via the processing-time inputting means 65 is outputted as it is via the processing-time outputting means 70, while the nodes in one combination properly formed by the combination-number back calculating means 66 are moved and assigned to the same initial block so that the number of node combinations with which the partitioning of the graph can be performed within the specific time is calculated. Next, the select-parameter determining means 67 calculates and determines the select parameter from the number of combinations.

Next, the graph partitioning means 71 moves the nodes grouped in numbers equal to or smaller than the value of the select parameter to the same initial block to obtain such partition data as to minimize the number of inter-block edges.

Next, the circuit partitioning means 72 performs partitioning of the circuit such that data on the partitioned circuit is equivalent to the partition data and outputs the data on the partitioned circuit to the second external memory 74.

Thus, according to the present embodiment, the upper limit can be placed on the total number of combinations by determining the select parameter indicating the number of nodes to be combined with each other, resulting in shorter processing time.

Moreover, since the processing time for partitioning can preliminarily be determined from the outside, the select parameter appropriate for the processing time can be determined, which provides a satisfactory compromise between optimized partitioning and processing time.

I claim:

1. A method of partitioning a circuit into a plurality of blocks, said circuit composed of a plurality of circuit elements and connecting elements, said method comprising:

a circuit-graph producing step of producing a graph having nodes representing said circuit elements and edges representing said connecting elements;

an initial-partitions generating step of partitioning said graph into a number of initial blocks;

a seed-node-set generating step of designating the nodes which are adjacent to each other and contained in different initial blocks as seed nodes, and selecting at least one of said seed nodes as a set of seed nodes;

a select-parameter determining step of determining a select parameter indicating a number of nodes to be combined with each other and moved together between said initial blocks;

an optimizing step of moving nodes including at least one of said seed nodes grouped in numbers equal to or smaller than the value of said select parameter to a same initial block and thereby reducing a number of edges extending between said initial blocks; and a blocking step of partitioning said circuit into resulting blocks wherein one or more of the nodes have been moved in the optimizing step.

2. A method according to claim 1, wherein said select parameter determining step includes the steps of:

initializing said select parameter; and selecting the seed nodes of the nodes indicated by said select parameter from said set of seed nodes, calculating a total number of node combinations formed by using said seed nodes, repeatedly performing a process of adding 1 to said select parameter until said total number of node combinations exceeds a specified value, and thereby determining the select parameter.

3. A method according to claim 1, wherein said select parameter determining step includes the step of calculating a total number of pins which is a total number of edges connected to a node and designating a natural number closest to a logarithmic value of said total number of pins as the select parameter.

4. A method according to claim 1, wherein said optimizing step includes:

a seed-node selecting step of selecting one seed node from said set of seed nodes as a current node to generate a set of selected nodes containing said current node as an element;

an evaluation-function-value obtaining step of designating, when all nodes of said set of selected nodes are moved to the same initial block, the number of edges extending between said initial blocks as an evaluation function value;

an optimum-value updating step of designating said set of selected nodes as a minimum set of selected nodes and designating said same initial block as an optimum block when said evaluation function value is a minimum value;

a first repeating step of repeatedly performing, when the number of nodes in said minimum set of selected nodes does not exceed said select parameter, an adjacent-node selecting step, the evaluation-function-value obtaining step, and the optimum-value updating step, said adjacent-node selecting step consisting of designating one node adjacent to said current node as a new current node, and adding said new current node to said minimum set of selected nodes; and a second repeating step of repeatedly performing, when the number of nodes in said minimum set of selected nodes exceeds said select parameter, a partition altering step, the seed-node selecting step, the evaluation-function-value obtaining step, and the optimum-value updating step until the set of seed nodes is successively and thoroughly selected, said partition altering step consisting of moving said minimum set of selected nodes to said optimum block.

5. A method according to claim 1, wherein said optimizing step includes:
- a seed-node selecting step of selecting one seed node from said set of seed nodes as a current node to generate a set of selected nodes containing said current node as an element;
- a select-parameter adjusting step of calculating a number of nodes lying on a path composed of said nodes and edges alternately arranged and connected to each other, said path starting from said current node and having a length equal to or smaller than a given value, and increasing or decreasing said select parameter depending on said calculated number of nodes;
- an evaluation-function-value obtaining step of obtaining, when said current node has been moved to said same initial block, an evaluation function value from an evaluation function for evaluating partitioning after the movement;
- an optimum-value updating step of designating said set of selected nodes as a minimum set of selected nodes and designating the block containing said current node as an optimum block when said evaluation function value is a minimum value;
- a first repeating step of repeatedly performing, when the number of nodes in said minimum set of selected nodes does not exceed said select parameter, an adjacent-node selecting step, the select-parameter adjusting step, the evaluation-function-value obtaining step, and the optimum-value updating step, said adjacent-node selecting step consisting of designating one node adjacent to said current node and said current node as new current nodes, and adding said new current nodes to said minimum set of selected nodes; and
- a second repeating step of repeatedly performing, when the number of nodes in said minimum set of selected nodes exceeds said select parameter, a partition altering step, the seed-node selecting step, the select-parameter adjusting step, the evaluation-function-value obtaining step, and the optimum-value updating step until the set of seed nodes is successively and thoroughly selected, said partition altering step consisting of moving said minimum set of selected nodes to said optimum block.

6. A method according to claim 5, wherein, the number of edges extending between said blocks is designated as said evaluation function.

7. A method according to claim 1, wherein the graph produced in said circuit-graph producing step is a directed graph having an edge directed from a starting point to an end point and said optimizing step includes:
- a seed-node selecting step of selecting one seed node from said set of seed nodes as a current node to generate a set of selected nodes containing said current node as an element;
- a first partition altering step of moving and assigning said set of selected nodes to the same initial block;
- an evaluation-function-value obtaining step of designating a number of starting nodes having edges starting therefrom and terminating at other nodes contained in different initial blocks as a number of output pins, and providing said number of output pins as an evaluation function value;
- an optimum-value updating step of designating said set of selected nodes as a minimum set of selected nodes and designating the initial block containing said selected nodes as an optimum block when said evaluation function value is a minimum value;
- a partition canceling step of returning said current node moved in said first partition altering step to the original initial block;
- a first repeating step of repeatedly performing, when the number of nodes in said minimum set of selected nodes does not exceed said select parameter, an adjacent-node selecting step, the first partition altering step, the evaluation-function-value obtaining step, the optimum-value updating step, and the partition canceling step, said adjacent-node selecting step consisting of designating one node adjacent to said current node as a new current node, and adding said new current node to said minimum set of selected nodes; and
- a second repeating step of repeatedly performing, when the number of nodes in said minimum set of selected nodes exceeds said select parameter, a partition altering step, the seed-node selecting step, the first partition altering step, the evaluation-function-value obtaining step, the optimum-value updating step, and the partition canceling step until the set of seed nodes is successively and thoroughly selected, said partition altering step consisting of moving said minimum set of selected nodes to said optimum block.

8. A method according to claim 7, wherein the evaluation function value in said evaluation-function-value obtaining step is provided by adding, to said number of output pins, a number of input pins obtained by counting, for each starting node, a number of said different initial blocks, and adding up the numbers of different initial blocks counted for all of the starting nodes.

9. A method according to claim 1, wherein the graph produced in said circuit-graph producing step is a directed graph having an edge directed from a starting point to an end point and said optimizing step includes:
- a seed-node selecting step of selecting one seed node from said set of seed nodes as a current node to generate a set of selected nodes containing said current node as an element;
- a pin-number-calculation-set generating step of generating a set of nodes for pin number calculation composed of all nodes in said set of selected nodes and all nodes adjacent to at least one current node in said set of selected nodes;
- an input/output-pin-number obtaining step of calculating a first number of input/output pins which is a sum of a number of output pins corresponding to a number of starting nodes contained in said set of nodes for pin number calculation having edges starting therefrom and terminating at other nodes contained in different initial blocks and a number of input pins obtained by counting, for each starting node, the numbers of different initial blocks, and adding up the numbers of different initial blocks counted for all of the starting nodes;
- a first partition altering step of moving and assigning said selected nodes to the same initial block and performing said input-output-pin-number obtaining step to obtain a second number of input/output pins after the movement;
- an evaluation-function-value obtaining step of designating a difference between said first number of input/output pins and said second number of input/output pins as an evaluation-function value;
- an optimum-value updating step of designating said set of selected nodes as a minimum set of selected nodes and designating the initial block containing said selected nodes as an optimum block when said evaluation function value is a minimum value;

a partition canceling step of returning said selected nodes moved in said first partition altering step to the original initial block;

a first repeating step of repeatedly performing, when the number of nodes in said minimum set of selected nodes does not exceed said select parameter, an adjacent-node selecting step, the input-output-pin-number obtaining step, the first partition altering step, the evaluation-function-value obtaining step, the optimum-value updating step, and the partition canceling step, said adjacent-node selecting step consisting of designating one node adjacent to said current node and said current node as new current nodes, and adding said new current nodes to said minimum set of selected nodes; and a second repeating step of repeatedly performing, when the number of nodes in said minimum set of selected nodes exceeds said select parameter, a partition altering step, the seed-node selecting step, the pin-number-calculation-set generating step, the input/output-pin-number obtaining step, the first partition altering step, the evaluation-function-value obtaining step, the optimum-value updating step, and the partition cancelling step until the set of seed nodes is successively and thoroughly selected, said partition altering step consisting of moving said minimum set of selected nodes to said optimum block.

10. A method according to claim 1, wherein said optimizing step includes:

a seed-node selecting step of selecting one seed node from said set of seed nodes as a current node to generate a set of selected nodes containing said current node as an element;

an on-alteration block-ratio calculating step of calculating, when said selected nodes have been moved and assigned to the same initial block, a post-movement ratio which is a ratio of the number of nodes contained in the original block to the number of nodes contained in the destination block after the movement and a pre-movement ratio which is a ratio of the number of nodes contained in said original block to the number of nodes contained in said destination block before the movement and comparing the post-movement ratio with the pre-movement ratio;

an evaluation-function-value obtaining step of evaluating a number of inter-block edges extending between said original block and said destination block after the movement when said post-movement ratio is closer to 1 than said pre-movement ratio;

an optimum-value updating step of designating said set of selected nodes as a minimum set of selected nodes and designating the initial block containing said selected nodes as an optimum block when said evaluation function value is a minimum value;

a first repeating step of repeatedly performing, when the number of nodes in said minimum set of selected nodes does not exceed said select parameter, an adjacent-node selecting step, said on-alteration block-ratio calculating step, said evaluation-function-value obtaining step, and said optimum-value updating step, said adjacent-node selecting step consisting of designating one node adjacent to said current node as a new current node, and adding said new current node to said minimum set of selected nodes; and a second repeating step of repeatedly performing, when the number of nodes in said minimum set of selected nodes exceeds said select parameter, a partition altering step, said seed node selecting step, said on-alteration block-ratio calculating step, said evaluation-function-value obtaining step, and said optimum-value updating step until the set of seed nodes is successively and thoroughly selected, said partition altering step consisting of moving said minimum set of selected nodes to said optimum block.

11. A method of partitioning a circuit into a plurality of block, said circuit composed of a plurality of circuit elements and connecting elements, said method comprising:

a circuit-graph producing step of producing a graph having nodes representing said circuit elements and edges representing said connecting elements;

a cluster generating step of clustering the nodes based on a desired number of partitions and thereby generating clusters;

a block generating step of generating at least one of said clusters as a block;

a graph updating step of deleting the nodes contained in said block and the edges connected to said nodes from the graph;

a repeating step of repeatedly performing said cluster generating step, said block generating step, and said graph updating step until a portion of the graph remaining after the deletion is completely deleted; and a blocking step of partitioning said circuit into blocks such that blocks of said circuit correspond to the blocks generated in said block generating step.

12. A method of partitioning a circuit into a plurality of blocks, said circuit composed of a plurality of circuit elements and connecting elements, said method comprising:

a circuit-graph producing step of producing a graph having nodes representing said circuit elements and edges representing said connecting elements;

an inter-edge-node-number obtaining step of adding, if an edge on said graph is contained in a cluster, a dimension of said cluster as a weight to the number of nodes, and calculating the number of nodes connected to the edge;

a group generating step of generating groups by selecting combinations of clusters that provide a minimum number of inter-edge nodes and a desired number of partitions such that a number of edges between the groups is minimized;

a repeating step of repeatedly performing said inter-edge-node-number obtaining step and said group generating step until said graph is completely grouped; and a blocking step of partitioning said circuit into blocks such that the resulting blocks of said circuit correspond to said groups.

13. An apparatus for partitioning a circuit into a plurality of blocks, said circuit composed of a plurality of circuit elements and connecting elements, said apparatus comprising:

circuit receiving means for receiving a circuit to be partitioned;

graph producing means for producing a graph having nodes representing said circuit elements and edges representing said connecting elements;

initial graph partitioning means for partitioning said graph into a number of initial blocks;

select-parameter determining means for determining a select parameter indicating a number of nodes to be combined with each other;

combination-number calculating means for calculating a total number of possible combinations of nodes, each combination containing a number of nodes that does not exceed the value of the select parameter;

processing-time calculating means for calculating, from said total number of possible combinations, processing time required to partition said graph;

processing-time outputting means for outputting said processing time;

graph partitioning means for optimally partitioning said graph by moving nodes grouped in numbers equal to or smaller than the value of said select parameter to a same initial block;

circuit partitioning means for partitioning the circuit such that said partitioned circuit corresponds to said partitioned graph; and circuit outputting means for outputting said partitioned circuit.

14. An apparatus for partitioning a circuit into a plurality of blocks, said circuit composed of a plurality of circuit elements and connecting elements, said apparatus comprising:

circuit receiving means for receiving a circuit to be partitioned;

graph producing means for producing a graph having nodes representing said circuit elements and edges representing said connecting elements;

initial graph partitioning means for partitioning said graph into a number of initial blocks, each containing one or more of said nodes;

processing-time receiving means for receiving a processing time required to optimize said graph;

combination-number back calculating means for calculating, when said one or more nodes combined with each other are moved to a same initial block to improve the partitioning of said graph, a total number of combinations that can be moved within said processing time;

select-parameter determining means for determining a select parameter indicating a number of nodes to be combined with each other based on said total number of combinations;

graph partitioning means for optimally partitioning said graph by moving and assigning nodes grouped in numbers equal to or smaller than the value of said select parameter to a same initial block;

circuit partitioning means for partitioning the circuit such that the partitioned circuit corresponds to said partitioned graph; and circuit outputting means for outputting said partitioned circuit.

15. A computer-readable recording medium storing a program for partitioning a circuit into a plurality of blocks, said circuit composed of a plurality of circuit elements and connecting elements, said program performing:

a circuit-graph producing procedure of producing a graph having nodes representing said circuit elements and edges representing said connecting elements;

an initial-partitions generating procedure of partitioning said graph into a plurality of initial blocks;

a seed-node-set generating procedure of designating the nodes which are adjacent to each other and contained in different initial blocks as seed nodes, and selecting at least one of said seed nodes as a set of seed nodes;

a select-parameter determining procedure of determining a select parameter indicating a number of nodes to be combined with each other and moved together between said initial blocks;

an optimizing procedure of reducing a number of edges extending between said initial blocks by moving selected nodes from the set of seed nodes grouped in numbers equal to or smaller than the value of said select parameter to a same initial block; and a blocking procedure of partitioning said circuit into resulting blocks wherein one or more of the nodes have been moved during the optimizing procedure.

* * * * *

UNITED STATES PATENT AND TRADEMARK OFFICE
CERTIFICATE OF CORRECTION

PATENT NO. : 5,926,632
DATED : July 20, 1999
INVENTOR(S) : Kawaguchi

It is certified that error appears in the above-identified patent and that said Letters Patent is hereby corrected as shown below:

In the Claims:

Claim 15, line 2, after "program", insert --for execution by a computer--.

Signed and Sealed this

Second Day of January, 2001

Attest:

Attesting Officer

Q. TODD DICKINSON
Commissioner of Patents and Trademarks